(12) United States Patent
Varadarajan et al.

(10) Patent No.: US 12,368,075 B2
(45) Date of Patent: Jul. 22, 2025

(54) GRAPHENE INTEGRATION

(71) Applicant: Lam Research Corporation, Fremont, CA (US)

(72) Inventors: Bhadri N. Varadarajan, Beaverton, OR (US); Ieva Narkeviciute, Portland, OR (US); Kashish Sharma, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 430 days.

(21) Appl. No.: 17/904,361

(22) PCT Filed: Feb. 18, 2021

(86) PCT No.: PCT/US2021/018606
§ 371 (c)(1),
(2) Date: Aug. 16, 2022

(87) PCT Pub. No.: WO2021/168134
PCT Pub. Date: Aug. 26, 2021

(65) Prior Publication Data
US 2022/0399230 A1 Dec. 15, 2022

Related U.S. Application Data

(60) Provisional application No. 62/978,765, filed on Feb. 19, 2020.

(51) Int. Cl.
*H01L 21/768* (2006.01)
(52) U.S. Cl.
CPC .. *H01L 21/76852* (2013.01); *H01L 21/76834* (2013.01); *H01L 21/7685* (2013.01)
(58) Field of Classification Search
CPC ......... H01L 21/76852; H01L 21/76834; H01L 21/7685
See application file for complete search history.

(56) References Cited

U.S. PATENT DOCUMENTS 6,451,705 B1 9/2002 Trapp et al.
8,623,761 B2 * 1/2014 Bonilla ............ H01L 23/53238
438/653
(Continued)

FOREIGN PATENT DOCUMENTS

CA 3113726 A1 * 6/2020 ........... A61N 1/0543
CN 103981507 A 8/2014
(Continued)

OTHER PUBLICATIONS

CN Office Action dated May 11, 2024 in CN Application No. 202080068732.8 with English translation.
(Continued)

*Primary Examiner* — Laura M Menz
(74) *Attorney, Agent, or Firm* — Weaver Austin Villeneuve & Sampson LLP

(57) ABSTRACT

Graphene is deposited on a metal surface of a semiconductor substrate at a deposition temperature compatible with back-end-of-line semiconductor processing. The graphene may be annealed at a temperature between the deposition temperature and a temperature sensitive limit of materials in the semiconductor substrate to improve film quality. Alternatively, the graphene may be treated by exposure to plasma with one or more oxidant species. The graphene may be encapsulated with an etch stop layer and hermetic barrier, where the etch stop layer includes a metal oxide deposited under conditions that do not change or that improve the film quality of the graphene. The graphene may be encapsulated with a hermetic barrier, where the hermetic barrier is deposited under conditions that do not damage the graphene.

20 Claims, 13 Drawing Sheets

(56) References Cited

U.S. PATENT DOCUMENTS

| | | | |
|---|---|---|---|
| 9,184,060 B1 | 11/2015 | Lee | |
| 9,209,136 B2* | 12/2015 | Barth | H01L 21/4853 |
| 9,337,149 B2* | 5/2016 | Im | H01L 23/53209 |
| 9,508,801 B2* | 11/2016 | Franklin | H10D 30/01 |
| 9,514,932 B2 | 12/2016 | Mallick et al. | |
| 9,837,270 B1 | 12/2017 | Varadarajan et al. | |
| 10,453,681 B2* | 10/2019 | Tapily | H01L 21/02175 |
| 10,465,291 B2* | 11/2019 | Yeh | C01B 7/01 |
| 11,205,618 B2* | 12/2021 | Yang | H01L 21/76876 |
| 11,626,282 B2* | 4/2023 | Lee | H10D 62/882 257/77 |
| 11,682,622 B2* | 6/2023 | Byun | H01L 23/53238 257/751 |
| 11,887,850 B2* | 1/2024 | Shin | H01L 21/02299 |
| 2003/0096504 A1 | 5/2003 | Ryu et al. | |
| 2008/0188081 A1 | 8/2008 | Chi et al. | |
| 2008/0265301 A1 | 10/2008 | Fang et al. | |
| 2008/0296736 A1 | 12/2008 | Fu et al. | |
| 2012/0080661 A1 | 4/2012 | Saito et al. | |
| 2012/0080796 A1 | 4/2012 | Wada et al. | |
| 2012/0139114 A1 | 6/2012 | Zhang et al. | |
| 2012/0276743 A1 | 11/2012 | Won et al. | |
| 2013/0059450 A1 | 3/2013 | Le Gouil et al. | |
| 2013/0089988 A1 | 4/2013 | Wang et al. | |
| 2014/0127896 A1 | 5/2014 | Bonilla et al. | |
| 2014/0284802 A1 | 9/2014 | Sakata et al. | |
| 2015/0079342 A1 | 3/2015 | Boyd et al. | |
| 2015/0132968 A1 | 5/2015 | Ren et al. | |
| 2015/0332932 A1 | 11/2015 | Hirotsu et al. | |
| 2015/0371851 A1 | 12/2015 | Lee et al. | |
| 2016/0005648 A1 | 1/2016 | Yang et al. | |
| 2016/0035676 A1* | 2/2016 | Im | H01L 23/53209 257/306 |
| 2016/0056384 A1 | 2/2016 | Barth | |
| 2016/0075560 A1 | 3/2016 | Kagaya et al. | |
| 2016/0204204 A1* | 7/2016 | Franklin | H01L 21/042 257/29 |
| 2016/0270237 A1* | 9/2016 | Cho | H01L 21/76834 |
| 2017/0029942 A1 | 2/2017 | Matsumoto | |
| 2017/0148640 A1 | 5/2017 | Wang et al. | |
| 2017/0178899 A1 | 6/2017 | Kabansky et al. | |
| 2017/0301537 A1 | 10/2017 | Behera et al. | |
| 2018/0033727 A1 | 2/2018 | Lee et al. | |
| 2018/0148832 A1 | 5/2018 | Chatterjee et al. | |
| 2018/0182612 A1 | 6/2018 | Fukuoka et al. | |
| 2018/0182664 A1 | 6/2018 | McHugh et al. | |
| 2019/0010604 A1 | 1/2019 | Boyd et al. | |
| 2019/0074164 A1 | 3/2019 | Li | |
| 2019/0093227 A1* | 3/2019 | Yeh | C23C 16/513 |
| 2019/0144283 A1 | 5/2019 | Jakobsen et al. | |
| 2019/0233942 A1 | 8/2019 | Haberle Tapia et al. | |
| 2019/0288132 A1* | 9/2019 | Wang | H10F 77/70 |
| 2019/0345609 A1 | 11/2019 | Chen et al. | |
| 2019/0363048 A1 | 11/2019 | Zhao et al. | |
| 2020/0118924 A1* | 4/2020 | Yang | H01L 23/5283 |
| 2020/0216949 A1 | 7/2020 | Bhuyan et al. | |
| 2021/0020444 A1 | 1/2021 | Tapily | |
| 2021/0082832 A1* | 3/2021 | Yang | H01L 21/76829 |
| 2021/0210346 A1 | 7/2021 | Shin et al. | |
| 2022/0375722 A1 | 11/2022 | Varadarajan et al. | |
| 2022/0399230 A1* | 12/2022 | Varadarajan | C23C 16/345 |
| 2023/0081817 A1 | 3/2023 | Belau et al. | |
| 2023/0245924 A1* | 8/2023 | Narkeviciute | H01L 21/32 257/760 |
| 2024/0030062 A1* | 1/2024 | Hausmann | C23C 16/45565 |
| 2024/0213159 A1* | 6/2024 | Parbatani | H01L 21/02312 |
| 2024/0282570 A1* | 8/2024 | Varadarajan | C23C 16/452 |
| 2024/0332128 A1* | 10/2024 | Uzoh | H01L 23/433 |
| 2024/0356062 A1* | 10/2024 | Hersam | H01M 4/134 |
| 2024/0395544 A1* | 11/2024 | Sharma | H01J 37/32449 |
| 2025/0096036 A1* | 3/2025 | Parbatani | H01L 21/321 |

FOREIGN PATENT DOCUMENTS

| | | | | |
|---|---|---|---|---|
| CN | 115428141 A | * | 12/2022 | C23C 16/00 |
| CN | 117981070 A | * | 5/2024 | C23C 16/04 |
| CN | 117999646 A | * | 5/2024 | C23C 16/04 |
| DE | 102013113853 A1 | * | 6/2015 | H01L 27/3225 |
| JP | H04176868 A | | 6/1992 | |
| JP | H0594970 A | | 4/1993 | |
| JP | H07169747 A | | 7/1995 | |
| JP | H1053883 A | | 2/1998 | |
| JP | 2000311890 A | | 11/2000 | |
| JP | 2011190156 A | | 9/2011 | |
| JP | 2013510071 A | | 3/2013 | |
| JP | 2015073096 A | | 4/2015 | |
| JP | 2015211139 A | | 11/2015 | |
| JP | 2016105465 A | | 6/2016 | |
| JP | 2017512181 A | | 5/2017 | |
| JP | 2018076604 A | | 5/2018 | |
| JP | 2018105998 A | | 7/2018 | |
| JP | 2023514831 A | * | 4/2023 | C23C 16/56 |
| JP | 2023513617 A | * | 7/2023 | H01J 37/32357 |
| JP | 2024518276 A | * | 5/2024 | C23C 16/04 |
| KR | 20150116570 A | | 10/2015 | |
| KR | 101633039 B1 | | 6/2016 | |
| KR | 20180075898 A | | 7/2018 | |
| KR | 20200112446 A | * | 10/2020 | H01B 5/14 |
| KR | 20220143731 A | * | 10/2022 | H01L 21/76852 |
| KR | 20230028788 A | * | 3/2023 | H01L 21/76829 |
| KR | 20230167695 A | * | 12/2023 | H01L 21/76832 |
| TW | 201304059 A | | 1/2013 | |
| TW | 201810592 A | | 3/2018 | |
| TW | 201819283 A | | 6/2018 | |
| TW | 201833364 A | | 9/2018 | |
| TW | 201839912 A | | 11/2018 | |
| TW | 201919992 A | | 6/2019 | |
| TW | 202124273 A | * | 7/2021 | C23C 16/26 |
| WO | WO-2013172792 A1 | | 11/2013 | |
| WO | WO-2014110446 A2 | | 7/2014 | |
| WO | WO-2019212986 A1 | | 11/2019 | |
| WO | WO-2019246191 A1 | | 12/2019 | |
| WO | WO-2021067118 A1 | * | 4/2021 | C23C 16/26 |
| WO | WO-2021168134 A1 | * | 8/2021 | C23C 16/00 |
| WO | WO-2021262527 A1 | * | 12/2021 | C23C 16/04 |
| WO | WO-2022221881 A1 | * | 10/2022 | B05D 1/60 |
| WO | WO-2023004328 A1 | * | 1/2023 | C23C 16/04 |
| WO | WO-2023004329 A1 | * | 1/2023 | C23C 16/04 |
| WO | WO-2023023009 A1 | * | 2/2023 | H01M 10/0525 |
| WO | WO-2024102081 A1 | * | 5/2024 | B01L 3/502707 |

OTHER PUBLICATIONS

JP Office Action dated Nov. 5, 2024 in JP Application No. 2022-519665 with English translation.
JP Office Action dated Oct. 8, 2024 in JP Application No. 2022-549012 with English translation.
TW Office Action dated May 23, 2024 in TW Application No. 109133813 with English translation.
TW Office Action dated May 31, 2024 in TW Application No. 110105693 with English translation.
TW Office Action dated Oct. 30, 2024 in TW Application No. 109133813 with English translation.
U.S. Advisory Action dated Jun. 27, 2024 in U.S. Appl. No. 17/753,776.
U.S. Non-Final Office Action dated Oct. 10, 2024 in U.S. Appl. No. 17/904,046.
Boyd, et al., 'Single-step deposition of high-mobility graphene at reduced temperatures' Nature Comm., Mar. 18, 2015, pp. 1-8.
Hiramatsu, M., et al., "Initial Growth Process of Carbon Nanowalls Synthesized by Radical Injection Plasma-enhanced Chemical Vapor Deposition," Journal of Applied Physics, 2009, vol. 106, 094302, pp. 1-7.
Hiramatsu, M., etal., "Fabrication of Carbon Nanowalls using Novel Plasma Processing," Japanese Journal of Applied Physics, 2006, vol. 45(6B), pp. 5522-5527.
Hori, M., et aL, "Radical-controlled Plasma Processing for Nanofabrication," Journal of Physics D: Applied Physics, 2011, vol. 44, 174027, pp. 1-17.

(56) References Cited

OTHER PUBLICATIONS

International Preliminary Report on Patentability and Written Opinion dated Apr. 11, 2024 in PCT Application No. PCT/US2022/077307.
International Preliminary Report on Patentability and Written Opinion dated Aug. 25, 2022 in Application No. PCT/US2021/015650.
International Preliminary Report on Patentability and Written Opinion dated Feb. 1, 2024 in PCT Application No. PCT/US2022/073905.
International Preliminary Report on Patentability and Written Opinion dated Feb. 1, 2024 in PCT Application No. PCT/US2022/073906.
International Preliminary Report on Patentability and Written Opinion dated Jan. 4, 2024 in PCT Application No. PCT/US2022/033777.
International Preliminary Report on Patentability dated Apr. 14, 2022 from PCT/US2020/052549.
International Preliminary Report on Patentability dated Jan. 5, 2023, in PCT Application PCT/US2021/037885.
International Preliminary Report on Patentability dated Oct. 26, 2023, in Application No. PCT/US2022/071758.
International Preliminary Report on Patentability dated Sep. 1, 2022, in PCT Application No. PCT/US2021/018606.
International Search Report and Written Opinion dated Aug. 5, 2022, in Application No. PCT/US2022/071758.
International Search Report and Written Opinion dated Jan. 13, 2021, in PCT Application No. PCT/US2020/052549.
International Search Report and Written Opinion dated Jan. 20, 2023 in PCT Application No. PCT/US2022/077307.
International Search Report and Written Opinion dated Jul. 8, 2021 in PCT Application No. PCT/US2021/015650.
International Search Report and Written Opinion dated Jun. 9, 2021 issued in Application No. PCT/US2021/018606.
International Search Report and Written Opinion dated Nov. 11, 2022 in PCT Application No. PCT/US2022/073906.
International Search Report and Written Opinion dated Nov. 16, 2022 in PCT Application No. PCT/US2022/073905.
International Search Report and Written Opinion dated Oct. 7, 2021, in PCT Application No. PCT/US2021/037885.
International Search Report and Written Opinion dated Oct. 13, 2022, in PCT Application No. PCT/US2022/033777.
Nogami, T. et al., "Electromigration and Line R of Graphene Capped Cu Dual Damascene Interconnect", 2021 IEEE International Electron Devices Meeting (IEDM). IEEE, 2021,4 pages.
U.S. Final Office Action dated Apr. 19, 2024 in U.S. Appl. No. 17/753,776.
U.S. Non-Final Office Action dated Dec. 22, 2023 in U.S. Appl. No. 17/753,776.
U.S. Appl. No. 18/291,200, inventor Varadarajan B, filed Jan. 22, 2024.
U.S. Appl. No. 18/291,532, inventor Parbatani A, filed Jan. 23, 2024.
U.S. Appl. No. 18/569,100, inventors Varadarajan B N, et al., filed Dec. 11, 2023.
U.S. Appl. No. 18/694,600, inventors Sharma K, et al., filed Mar. 22, 2024.
U.S. Restriction requirement dated Jun. 22, 2023, in U.S. Appl. No. 17/753,776.
Zhang, Y., et al., "Low Temperature Remote Plasma Enhanced Atomic Layer Deposition of Graphene and Characterization of Its Atomic Level Structure," Journal of Materials Chemistry c 2014, vol. 2, pp. 7570-7574.
CN Office Action dated Jan. 9, 2025 in CN Application No. 202080068732.8 with English translation.
SG Written Opinion dated Jan. 9, 2025 in SG Application No. 11202202928P.
TW Office Action dated Jan. 7, 2025 in TW Application No. 110122691 with English translation.
U.S. Notice of Allowance dated Mar. 12, 2025 in U.S. Appl. No. 17/904,046.
CN Office Action dated Mar. 22, 2025 in CN Application No. 202080068732.8, with English Translation.
KR Office Action dated Apr. 8, 2025 in KR Application No. 10-2022-7031230, with English Translation.
KR Office Action dated Jun. 13, 2025 in KR Application No. 10-2023-7002700, with English Translation.
US Non-Final Office Action dated Apr. 24, 2025 in U.S. Appl. No. 17/753,776.
US Non-Final Office Action dated May 20, 2025 in U.S. Appl. No. 18/002,043.
KR Office Action dated May 8, 2025 in KR Application No. 10-2022-7032313, with English Translation.

* cited by examiner

GRAPHENE INTEGRATION

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Graphene is an allotrope of carbon in which the atoms are arrayed in a single atom sheet in a regular hexagonal pattern. Graphene has attracted interest in many fields and industries because of its high electrical conductivity, high thermal conductivity, good mechanical strength and toughness, optical transparency, and high electron mobility, among other favorable properties. Interest is growing in graphene in the semiconductor industry.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of encapsulating graphene in a semiconductor substrate. The method includes providing a semiconductor substrate, where the semiconductor substrate includes a metal layer formed in a dielectric layer, selectively depositing graphene on the metal layer, where the semiconductor substrate is maintained at a deposition temperature less than a semiconductor processing temperature limit during selective deposition of graphene, depositing a metal oxide over at least the graphene by a thermal-based deposition technique, and depositing a hermetic barrier over the metal oxide.

In some implementations, the method further includes treating a surface of the graphene prior to depositing the metal oxide by exposure to plasma. In some implementations, the plasma includes an $H_2$ and $O_2$ plasma, $H_2O$ and $O_2$ plasma, or $N_2$ and $O_2$ plasma. In some implementations, exposure to plasma occurs at a temperature between about 10° C. and about 100° C., at a pressure between about 0.5 Torr and about 5 Torr, and for a duration between about 1 second and about 10 seconds. In some implementations, the metal oxide comprises aluminum oxide, hafnium oxide, zirconium oxide, yttrium oxide, or combinations thereof. In some implementations, the metal oxide comprises aluminum oxide. Depositing the aluminum oxide over at least graphene may include introducing a dose of an aluminum-containing precursor to the semiconductor substrate, and exposing the semiconductor substrate to an oxidant to react with the aluminum-containing precursor and form aluminum oxide over graphene. In some implementations, a D peak of a Raman spectrum characterizing graphene is decreased after forming aluminum oxide over graphene. In some implementations, the hermetic barrier comprises a nitrogen-doped silicon carbide, oxygen-doped silicon carbide, or silicon nitride.

Also provided herein is a method of encapsulating graphene in a semiconductor substrate. The method includes providing a semiconductor substrate, where the semiconductor substrate includes a metal layer formed in a dielectric layer, selectively depositing graphene on the metal layer, where the semiconductor substrate is maintained at a deposition temperature less than a semiconductor processing temperature limit during selective deposition of graphene, and depositing a hermetic barrier over the graphene by a non-direct plasma deposition technique.

In some implementations, the method further includes treating a surface of the graphene prior to depositing the metal oxide by exposure to plasma. In some implementations, the plasma includes an $H_2$ and $O_2$ plasma, $H_2O$ and $O_2$ plasma, or $N_2$ and $O_2$ plasma. Depositing the hermetic barrier may include flowing a silicon-containing precursor to the semiconductor substrate in a reaction chamber, generating, from a source gas, radicals in a remote plasma source that are generated upstream of the silicon-containing precursor, and introducing the radicals into the reaction chamber and to the semiconductor substrate, where the radicals react with the silicon-containing precursor to form the hermetic barrier over the graphene. In some implementations, the hermetic barrier includes nitrogen-doped silicon carbide, oxygen-doped silicon carbide, or silicon nitride. In some implementations, the method further includes depositing an etch stop by a thermal-based deposition technique over the graphene prior to depositing the hermetic barrier.

Also provided herein is a method of treating graphene in a semiconductor substrate. The method includes providing a semiconductor substrate, where the semiconductor substrate includes a metal layer formed in a dielectric layer, selectively depositing graphene on the metal layer, where the semiconductor substrate is maintained at a deposition temperature less than a semiconductor processing temperature limit during selective deposition of graphene, and annealing the graphene at a temperature range that is between the deposition temperature and the semiconductor processing temperature limit.

In some implementations, the temperature range for annealing the graphene is 250° C. to 400° C. In some implementations, the method further includes depositing an etch stop layer over the graphene, and depositing a hermetic barrier over the etch stop layer. In some implementations, depositing the etch stop layer comprises depositing aluminum oxide using thermal ALD or thermal CVD. In some implementations, the method further includes depositing a nitrogen-doped silicon carbide, oxygen-doped silicon carbide, or silicon nitride over the graphene by a non-direct plasma deposition technique. In some implementations, the metal layer includes copper, ruthenium, aluminum, nickel, cobalt, tungsten, molybdenum, or combinations thereof.

Also provided herein is a method of treating graphene in a semiconductor substrate. The method includes providing a semiconductor substrate, where the semiconductor substrate includes a metal layer formed in a dielectric layer, selectively depositing graphene on the metal layer, where the semiconductor substrate is maintained at a deposition temperature less than a semiconductor processing temperature limit during selective deposition of graphene, and treating a surface of the graphene by exposure to plasma.

In some implementations, the plasma includes one or more oxidant species. In some implementations, the plasma includes an $H_2$ and $O_2$ plasma, $H_2O$ and $O_2$ plasma, or $N_2$ and $O_2$ plasma. In some implementations, exposure to plasma occurs at a temperature between about 10° C. and about 100° C., at a pressure between about 0.5 Torr and about 5 Torr, and for a duration between about 1 second and about 10 seconds. In some implementations, a concentration of the one or more oxidant species in the plasma is equal to or less than a concentration of a co-flowed reactant in the plasma. In some implementations, the plasma is a remote plasma. In some implementations, the plasma is a direct plasma. In some implementations, treating the surface of the graphene promotes nucleation by adding terminal hydroxyl groups (—OH) at the surface of the graphene. In some implementations, the method further includes depositing a metal oxide over the surface of the graphene, where the graphene is treated prior to deposition of the metal oxide.

Also provided herein is a method of depositing graphene on patterned metal features. The method includes providing a semiconductor substrate, where the semiconductor substrate includes a metal layer, patterning the metal layer by subtractive patterning to form patterned metal features, and selectively depositing graphene on exposed surfaces of the patterned metal features, wherein the semiconductor substrate is maintained at a deposition temperature less than a semiconductor processing temperature limit during selective deposition of graphene.

In some implementations, the method further includes depositing low-k dielectric material around the graphene and in spaces between patterned metal features, where the graphene serves as a diffusion barrier layer between the low-k dielectric material and the patterned metal features. In some implementations, a thickness of the graphene is between about 1 nm and about 6 nm. In some implementations, the low-k dielectric material includes a fluorine-doped or carbon-doped silicon oxide.

DETAILED DESCRIPTION

Figure 1:
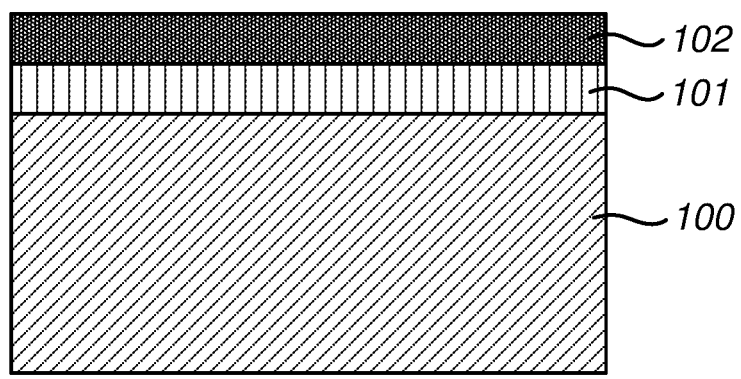
FIG. 1 illustrates a cross-sectional schematic of an example substrate having a metal surface with graphene deposited thereon according to some implementations.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Deposition of Graphene

There is a growing interest in synthesizing large-area graphene films in semiconductor applications. However, there are many challenges associated with production of graphene in sufficient quantities and under suitable conditions for semiconductor integration. Many production methods suffer from low surface coverage because of the difficulty of growing graphene with minimal defects. Thus, scalability to produce large-area graphene films represents a particular problem, especially large-area graphene films on semiconductor wafers. Furthermore, graphene films are typically grown by thermal chemical vapor deposition (CVD). Thermal CVD methods are generally favored for synthesis of large-area, high-quality graphene. However, thermal CVD of graphene is often performed at elevated temperatures, which may not necessarily be compatible with semiconductor applications. Under such high temperatures, various materials such as semiconductors and metals on semiconductor wafers may be physically damaged.

Thermal CVD is a common method of depositing graphene. The thermal CVD process involves at least two steps: activation of gaseous precursors and chemical reaction to form a stable, solid film on a suitable substrate. In thermal CVD, activation of gaseous precursors can occur by thermal decomposition. At elevated temperatures, hydrocarbon precursors thermally decompose and adsorb onto a substrate surface. Hydrocarbon radicals are chemically reactive and may interact with the substrate surface. The substrate surface may be a metal surface that acts as a catalyst for nucleation and growth of graphene. Without being limited by any theory, the catalytic metal surface may dehydrogenate the hydrocarbon radicals so that carbon atoms may bond with other carbon atoms, thereby promoting nucleation and growth of graphene. Various transition metals such as copper have been recognized as catalysts for nucleation and growth of graphene.

Activation of hydrocarbon species and graphene growth can depend on factors such as temperature and the metal surface on which graphene is grown. In addition, graphene growth can depend on carbon solubility on the metal surface. If the metal has high carbon solubility, carbon more easily dissolves in the metal and tends to precipitate on the metal surface. This generally leads to less uniform graphene layers and more microstructural defects owing to multiple nucleation sites and an unpredictable quantity of segregated carbon on the metal surface. Nickel substrates, for example, have high carbon solubility and typically lead to multiple layers of low-quality graphene or disordered carbon. If the metal has low carbon solubility, carbon less easily dissolves in the metal and results in an extensive surface migration of carbon adatoms on the metal surface and minimal diffusion into bulk metal. This generally leads to more uniform graphene layers and fewer microstructural defects owing to more controlled growth. Copper substrates, for example, have low carbon solubility and result in epitaxial growth of high-quality graphene. The high-quality graphene may be grown as a single layer, bilayer, or few-layer graphene film.

Plasma-enhanced chemical vapor deposition (PECVD) is another method of depositing graphene. Whereas thermal CVD methods activate hydrocarbon precursors by thermal decomposition, energized electrons generated by plasma cause ionization, excitation, and dissociation of hydrocarbon precursors in PECVD methods. The plasma may be formed in-situ or remotely. Typically, hydrocarbon precursors (e.g., methane) are activated in a plasma and a substrate is exposed to the plasma. The plasma may be generated using a radio-frequency (RF) plasma source, microwave (MW) plasma source, surface wave (SW) plasma source, or remote plasma source. By way of an example, molecular hydrogen and methane gas may be introduced in a reaction chamber and direct RF plasma may be ignited to promote graphene growth on a substrate. With PECVD, graphene growth in some PECVD methods may be performed at lower temperatures compared to thermal CVD methods. Moreover, graphene growth in some PECVD methods may be accomplished on non-metal substrates such as dielectric materials. In other words, plasma-based methods may deposit graphene in the absence of metal catalysts. Plasma-based methods may deposit graphene at lower temperatures and without the assistance of metal catalysts.

FIG. 1A illustrates a cross-sectional schematic of an example substrate having a metal surface with graphene deposited thereon according to some implementations. The substrate 100 can be any wafer, semiconductor wafer, partially fabricated integrated circuit, printed circuit board, display screen, or other appropriate workpiece. In some implementations, the substrate 100 is a semiconductor substrate such as a silicon (Si) substrate. The substrate 100 can include a metal surface 101. As discussed below, the metal surface 101 can also be referred to as a temperature sensitive underlayer. In some implementations, the metal surface 101 can include any appropriate metal such as a transition metal. For example, the metal surface 101 can include copper (Cu), ruthenium (Ru), nickel (Ni), molybdenum (Mo), cobalt (Co), or combinations thereof. A graphene film 102 can be deposited on the metal surface 101.

In some implementations, depositing the graphene film 102 on the metal surface 101 of the substrate 100 may be accomplished by remote hydrogen plasma CVD. In some other implementations, depositing the graphene film 102 on the metal surface 101 of the substrate 100 may be accomplished using any suitable deposition technique such as thermal CVD or PECVD. A remote hydrogen plasma CVD method may deposit the graphene film 102 at low temperatures that are compatible with semiconductor processing, such as back end of line (BEOL) semiconductor processing. In some implementations, the graphene film 102 may be deposited at temperatures below about 500° C., below about 450° C., below about 400° C., below about 350° C., below about 300° C., or between about 200° C. and about 400° C.

When depositing the graphene film 102 using remote hydrogen plasma CVD, a hydrocarbon precursor is flowed to the metal surface 101 of the substrate 100 and hydrogen radicals are generated in a remote plasma source upstream of the hydrocarbon precursor flow. The hydrogen radicals interact with the hydrocarbon precursor to activate the hydrocarbon precursor downstream from the remote plasma source, and the activated hydrocarbon precursor interacts with the metal surface 101 to cause graphene film 102 to deposit. In some implementations, the hydrocarbon precursor includes an alkene group or alkyne group.

In some implementations of the present disclosure, the substrate 100 can include a temperature sensitive underlayer 101. The temperature sensitive underlayer 101 may have a temperature sensitive limit. Above the temperature sensitive limit of the temperature sensitive underlayer 101, the temperature sensitive underlayer 101 melts or is otherwise physically damaged. The temperature sensitive limit may be between about 400° C. and about 700° C. for many materials of the temperature sensitive underlayer 101. Some thermal CVD methods and some conventional plasma-based CVD methods may exceed the temperature sensitive limit of the temperature sensitive underlayer 101. Examples of temperature sensitive underlayers 101 can include transition metals such as copper, cobalt, and ruthenium. In some implementations, a graphene film 102 is deposited on the temperature sensitive underlayer 101. In some implementations, the graphene film 102 is deposited at sufficiently low temperatures that do not melt or otherwise physically damage the temperature sensitive underlayer 101. The substrate 100 may be a semiconductor wafer or semiconductor workpiece. Hence, the graphene film 102 may be deposited as a large-area graphene film on the substrate 100 at full wafer level.

In some implementations, the graphene film 102 is deposited using remote hydrogen plasma CVD. As used herein, the term "remote" in literature generally refers to the remoteness of the substrate from the plasma. As used herein, a "remote plasma" is a plasma in which plasma generation occurs at a location that is remote from the substrate. Here, the remote hydrogen plasma may contain hydrogen radicals but does not contain carbon radicals. Instead, carbon radicals are generated downstream from a remote plasma source. This means that in the "remote plasma" of some implementations, precursor gas is not introduced into the plasma-generating region. Hydrocarbon precursors are independently flowed into a reaction chamber and are activated by hydrogen radicals generated from the remote plasma source. Moreover, the carbon radicals are generated from hydrocarbon precursors containing alkene or alkyne groups. In fact, hydrocarbon precursors that are alkanes (e.g., methane) do not deposit in implementations involving remote hydrogen plasma CVD. When using the remote hydrogen plasma CVD method, graphene deposition selectively deposits on metal surfaces. Graphene does not deposit on dielectric or other non-metal surfaces. The remote hydrogen plasma CVD method is an example method that can deposit high-quality graphene film at low temperatures suitable for semiconductor applications. For example, a high-quality graphene film can serve as an effective barrier layer in damascene or dual damascene structures. Further, the high-quality graphene can serve as a capping layer on top of the metal surface, which reduces resistance by reducing surface scattering. However, it will be understood that the high-quality graphene film may be used in a wide number of industrial applications.

One aspect of the disclosure is an apparatus configured to accomplish the graphene deposition methods described herein. A suitable apparatus includes hardware for accomplishing the process operations and a system controller having instructions for controlling process operations in accordance with the present disclosure. In some implementations, the apparatus for performing the aforementioned process operations can include a remote plasma source. A remote plasma source provides mild reaction conditions compared to a direct plasma.

Figure 2:
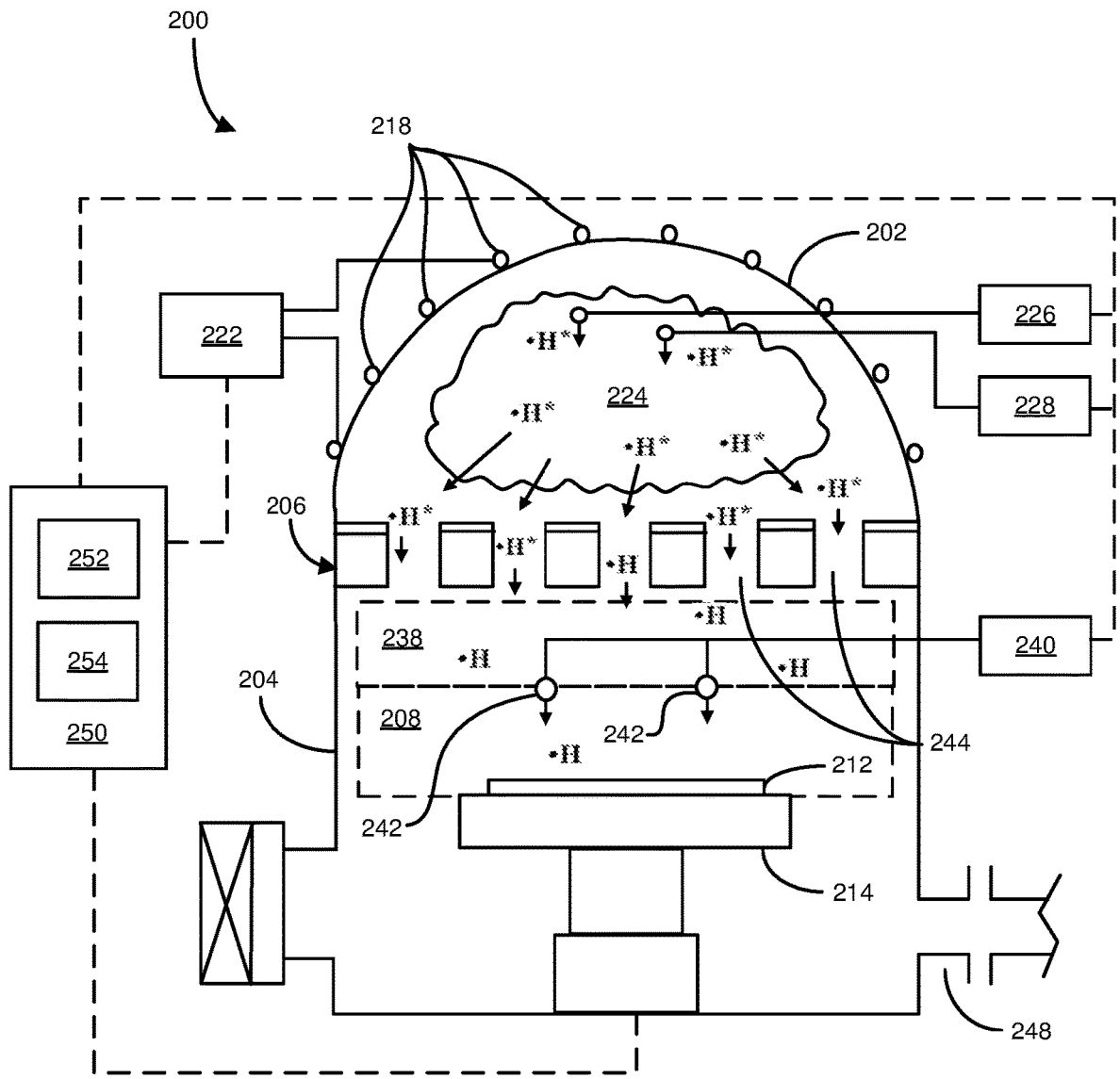
FIG. 2 illustrates a schematic diagram of an example plasma processing apparatus with a remote plasma source according to some implementations.

FIG. 2 illustrates a schematic diagram of an example plasma processing apparatus with a remote plasma source according to some implementations. The plasma processing apparatus 200 includes the remote plasma source 202 separated from a reaction chamber 204. The remote plasma source 202 is fluidly coupled with the reaction chamber 204 via a showerhead 206, which may also be referred to as a multiport gas distributor. Radical species are generated in the remote plasma source 202 and supplied to the reaction chamber 204. One or more hydrocarbon precursors are supplied to the reaction chamber 204 downstream from the remote plasma source 202 and downstream from the showerhead 206. The one or more hydrocarbon precursors react with the radical species in a chemical vapor deposition zone 208 of the reaction chamber 204 to deposit a graphene film on a front surface of a substrate 212. The chemical vapor deposition zone 208 includes an environment adjacent to the front surface of the substrate 212, where the front surface of the substrate 212 faces the remote plasma source 202.

The substrate 212 is supported on a substrate support or pedestal 214. The pedestal 214 may move within the reaction chamber 204 to position the substrate 212 within the chemical vapor deposition zone 208. In the embodiment shown in FIG. 2, pedestal 214 is shown having elevated the substrate 210 within the chemical vapor deposition zone 208. The pedestal 214 may also adjust the temperature of the substrate 212 in some embodiments, which can provide some selective control over thermally activated surface reactions on the substrate 212.

FIG. 2 shows a coil 218 arranged around the remote plasma source 202, where the remote plasma source 202 includes an outer wall (e.g., quartz dome). The coil 218 is electrically coupled to a plasma generator controller 222, which may be used to form and sustain plasma within a plasma region 224 via inductively coupled plasma generation. In some implementations, the plasma generator controller 222 may include a power supply for supplying power to the coil 218, where the power can be in a range between about 1 and 6 kilowatts (kW) during plasma generation. In some implementations, electrodes or antenna for parallel plate or capacitively coupled plasma generation may be used to generate a continuous supply of radicals via plasma excitation rather than inductively coupled plasma generation. Regardless of the mechanism used to ignite and sustain the plasma in the plasma region 224, radical species may continuously be generated using plasma excitation during film deposition. In some implementations, hydrogen radicals are generated under approximately steady-state conditions during steady-state film deposition, though transients may occur at the beginning and end of film deposition.

A supply of hydrogen radicals may be continuously generated within the plasma region 224 while hydrogen gas or other source gas is being supplied to the remote plasma source 202. Excited hydrogen radicals may be generated in the remote plasma source 202. If not re-excited or re-supplied with energy, or re-combined with other radicals, the excited hydrogen radicals lose their energy, or relax. Thus, excited hydrogen radicals may relax to form hydrogen radicals in a substantially low energy state or ground state. The hydrogen radicals in the substantially low energy state or ground state.

The hydrogen gas ($H_2$) or other source gas may be diluted with one or more additional gases. These one or more additional gases may be supplied to the remote plasma source 202. In some implementations, the hydrogen gas or other source gas is mixed with one or more additional gases to form a gas mixture, where the one or more additional gases can include a carrier gas. Non-limiting examples of additional gases can include helium (He), neon (Ne), argon (Ar), krypton (Kr), xenon (Xe), and nitrogen ($N_2$). The one or more additional gases may support or stabilize steady-state plasma conditions within the remote plasma source 202 or aid in transient plasma ignition or extinction processes. In some implementations, diluting hydrogen gas or other source gas with helium, for example, may permit higher total pressures without concomitant plasma breakdown. Put another way, a dilute gas mixture of hydrogen gas and helium may permit higher total gas pressure without increasing plasma power to the remote plasma source 202. In certain embodiments, hydrogen gas is provided in a carrier such helium. As an example, hydrogen gas may be provided in a helium carrier at a concentration of about 1-25% hydrogen or about 1-10% hydrogen.

As shown in FIG. 2, a source gas supply 226 is fluidly coupled with the remote plasma source 202 for supplying the hydrogen gas or source gas. In addition, an additional gas supply 228 is fluidly coupled with the remote plasma source 202 for supplying the one or more additional gases. The one or more additional gases may also include a co-reactant gas. While the embodiment in FIG. 2 depicts the gas mixture of the source gas and the one or more additional gases being introduced through separate gas outlets, it will be understood that the gas mixture may be introduced directly into the remote plasma source 202. That is, a pre-mixed dilute gas mixture may be supplied to the remote plasma source 202 through a single gas outlet.

Gases, such as excited hydrogen and helium radicals and relaxed gases/radicals, flow out of the remote plasma source 202 and into the reaction chamber 204 via the showerhead 206. Gases within the showerhead 206 and within the reaction chamber 204 are generally not subject to continued plasma excitation therein. In some implementations, the showerhead 206 includes an ion filter and/or a photon filter. Filtering ions and/or photons may reduce substrate damage, undesirable re-excitation of molecules, and/or selective breakdown or decomposition of hydrocarbon precursors within the reaction chamber 204. Showerhead 206 may have a plurality of gas ports 234 to diffuse the flow of gases into the reaction chamber 204. In some implementations, the plurality of gas ports 234 may be mutually spaced apart. In some implementations, the plurality of gas ports 234 may be arranged as an array of regularly spaced apart channels or through-holes extending through a plate separating the remote plasma source 202 and the reaction chamber 204. The plurality of gas ports 234 may smoothly disperse and diffuse exiting radicals from the remote plasma source 202 into the reaction chamber 204.

Typical remote plasma sources are far removed from reaction vessels. Consequently, radical extinction and recombination, e.g., via wall collision events, may reduce active species substantially. In contrast, in some implementations, dimensions for the plurality of gas ports 234 may be configured in view of the mean free path or gas flow residence time under typical processing conditions to aid the free passage of radicals into the reaction chamber 204. In some implementations, openings for the plurality of gas ports 234 may occupy between about 5% and about 20% of an exposed surface area of the showerhead 206. In some implementations, the plurality of gas ports 234 may each have an axial length to diameter ratio of between about 3:1 and 10:1 or between about 6:1 and about 8:1. Such aspect ratios may reduce wall-collision frequency for radical species passing through the plurality of gas ports 234 while providing sufficient time for a majority of excited state radical species to relax to ground state radical species. In some implementations, dimensions of the plurality of gas ports 234 may be configured so that the residence time of gases passing through the showerhead 206 is greater than the typical energetic relaxation time of an excited state radical species. Excited state radical species for hydrogen source gas may be denoted by •H* in FIG. 2 and ground state radical species for hydrogen source gas may be denoted by •H in FIG. 2.

In some implementations, excited state radical species exiting the plurality of gas ports 234 may flow into a relaxation zone 238 contained within an interior of the reaction chamber 204. The relaxation zone 238 is positioned upstream of the chemical vapor deposition zone 208 but downstream of the showerhead 206. Substantially all or at least 90% of the excited state radical species exiting the showerhead 206 will transition into relaxed state radical species in the relaxation zone 238. Put another way, almost all of the excited state radical species (e.g., excited hydrogen radicals) entering the relaxation zone 238 become de-excited or transition into a relaxed state radical species (e.g., ground state hydrogen radicals) before exiting the relaxation zone 238. In some implementations, process conditions or a geometry of the relaxation zone 238 may be configured so that the residence time of radical species flowing through the relaxation zone 238, e.g., a time determined by mean free path and mean molecular velocity, results in relaxed state radical species flowing out of the relaxation zone 238.

With the delivery of radical species to the relaxation zone 238 from the showerhead 206, one or more hydrocarbon precursors may be introduced into the chemical vapor deposition zone 208. The one or more hydrocarbon precursors may be introduced via a gas distributor or gas outlet 242, where the gas outlet 242 may be fluidly coupled with a precursor supply source 240. The relaxation zone 238 may be contained within a space between the showerhead 206 and the gas outlet 242. The gas outlet 242 may include mutually spaced apart openings so that the flow of the one or more hydrocarbon precursors may be introduced in a direction parallel with gas mixture flowing from the relaxation zone 238. The gas outlet 242 may be located downstream from the showerhead 206 and the relaxation zone 238. The gas outlet 242 may be located upstream from the chemical vapor deposition zone 208 and the substrate 212. The chemical vapor deposition zone 208 is located within the interior of the reaction chamber 204 and between the gas outlet 242 and the substrate 212.

Substantially all of the flow of the one or more hydrocarbon precursors may be prevented from mixing with excited state radical species adjacent to the showerhead 206. Relaxed or ground state radical species mix in a region adjacent to the substrate 212 with the one or more hydrocarbon precursors. The chemical vapor deposition zone 208 includes the region adjacent to the substrate 212 where the relaxed or ground state radical species mix with the one or more hydrocarbon precursors. The relaxed or ground state radical species mix with the one or more hydrocarbon precursors in the gas phase during CVD formation of graphene.

In some implementations, a co-reactant may be introduced from the showerhead 206 and flowed along with the radical species generated in the remote plasma source 202 and into the reaction chamber 204. This may include radicals and/or ions of a co-reactant gas provided in the remote plasma source 202. The co-reactant may be supplied from the additional gas supply 228. In some implementations, the co-reactant may include a nitrogen-containing agent such as nitrogen gas ($N_2$). For example, radicals and/or ions of nitrogen may be generated and flowed with the radical species of hydrogen during pretreatment of a metal surface of the substrate 212.

The gas outlet 242 may be separated from the showerhead 206 by a sufficient distance to prevent back diffusion or back streaming of the one or more hydrocarbon precursors. This can afford sufficient time for radical species of hydrogen to transition from an excited state to a relaxed state (e.g., ground state). In some implementations, the gas outlet 242 may be separated from the plurality of gas ports 234 by a distance between about 0.5 inches and about 5 inches, or between about 1.5 inches and about 4.5 inches, or between about 1.5 inches and about 3 inches.

Process gases may be removed from the reaction chamber 204 via an outlet 248 that is fluidly coupled to a pump (not shown). Thus, excess hydrocarbon precursors, co-reactants, radical species, and diluent and displacement or purge gases may be removed from the reaction chamber 204. In some implementations, a system controller 250 is in operative communication with the plasma processing apparatus 200. In some implementations, the system controller 250 includes a processor system 252 (e.g., microprocessor) configured to execute instructions held in a data system 254 (e.g., memory). In some implementations, the system controller 250 may be in communication with the plasma generator controller 222 to control plasma parameters and/or conditions. In some implementations, the system controller 250 may be in communication with the pedestal 214 to control pedestal elevation and temperature. In some implementations, the system controller 250 may control other processing conditions, such as RF power settings, frequency settings, duty cycles, pulse times, pressure within the reaction chamber 204, pressure within the remote plasma source 202, gas flow rates from the source gas supply 226 and the additional gas supply 228, gas flow rates from the precursor supply source 240 and other sources, temperature of the pedestal 214, and temperature of the reaction chamber 204, among others.

The controller 250 may contain instructions for controlling process conditions for the operation of the plasma processing apparatus 200. The controller 250 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 250 or they may be provided over a network.

In certain embodiments, the controller 250 controls all or most activities of the plasma processing apparatus 200 described herein. For example, the controller 250 may control all or most activities of the plasma processing apparatus 200 associated with depositing graphene and, optionally, other operations in a fabrication flow that includes the graphene. The controller 250 may execute system control software including sets of instructions for controlling the timing, gas composition, gas flow rates, chamber pressure, chamber temperature, RF power levels, substrate position, and/or other parameters. Other computer programs, scripts, or routines stored on memory devices associated with the controller 250 may be employed in some embodiments. To provide relatively mild reactive conditions at the environment adjacent to the substrate 212, parameters such as the RF power levels, gas flow rates to the plasma region 224, gas flow rates to the chemical vapor deposition zone 208, and timing of the plasma ignition can be adjusted and maintained by controller 250. Additionally, adjusting the substrate position may further reduce the presence of high-energy radical species at the environment adjacent to the substrate 212. In a multi-station reactor, the controller 250 may comprise different or identical instructions for different apparatus stations, thus allowing the apparatus stations to operate either independently or synchronously.

In some embodiments, the controller 250 may include instructions for performing operations such as flowing one or more hydrocarbon precursors through the gas outlet 242 into the reaction chamber 204, providing a source gas into the remote plasma source 202, generating one or more radical species of the source gas in the remote plasma source 202 upstream of the one or more hydrocarbon precursors, introducing the one or more radical species from the remote plasma source 202 into the reaction chamber 204 to react with the one or more hydrocarbon precursors to deposit a graphene on a metal surface of the substrate 212. The one or more radical species in the reaction chamber 204 in an environment adjacent to the substrate 212 may be hydrogen radicals in a ground state. In some implementations, the controller 250 may include instructions for treating the metal surface of the substrate 212 prior to depositing graphene. In some implementations, the controller 250 may include instructions for maintaining a temperature of the substrate 212 equal to or less than about 400° C., or between about 200° C. and about 400° C. In some implementations, each of the one or more hydrocarbon precursors includes an alkene or alkyne group.

In some embodiments, the apparatus 200 may include a user interface associated with controller 250. The user interface may include a display screen, graphical software displays of the apparatus 200 and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to graphene deposition described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Raman spectroscopy can be used for the characterization of graphene. Raman spectroscopy can also be suitable for determining the number of graphene layers as well as the amount of disorder in graphene. By identifying certain features of graphene in a Raman spectrum, graphene can be distinguished from disordered or amorphous carbon layers.

Figure 3:
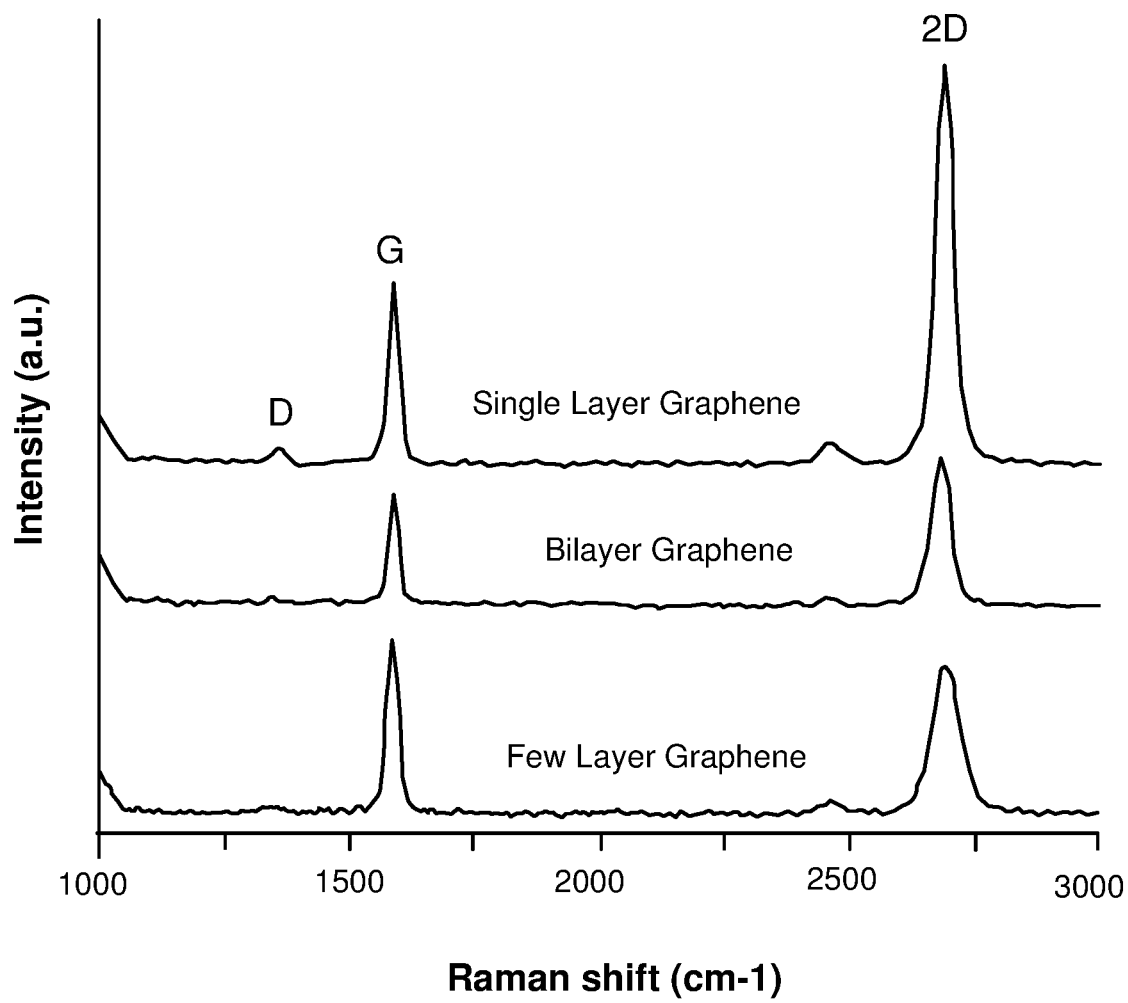
FIG. 3 illustrates a graph showing Raman spectra of examples of single layer graphene and multi-layer graphene according to some implementations.

FIG. 3 illustrates a graph showing Raman spectra of examples of single layer graphene and multi-layer graphene according to some implementations. Graphene can be characterized in a Raman spectrum by the presence of a G peak at around 1580 cm$^{-1}$ and a 2D peak at around 2680 cm$^{-1}$, where the 2D peak is generally equal to or greater in intensity than the G peak. If the 2D peak is significantly less in intensity than the G peak, then the deposited film is not characterized as graphene. The presence of the 2D peak and the G peak are generally strong indicators of the presence of graphene. Disordered carbon or amorphous carbon, however, can be characterized in a Raman spectrum by the presence of a D peak at around 1380 cm$^{-1}$. As disorder increases, the Raman intensity of the D peak usually increases. The higher the D peak, the greater the number of defects in the as-deposited graphene. Such defects may include but are not limited to vacancies that signal a lack of graphene, or grain boundaries of different graphene crystals that otherwise disrupt the planar structure of graphene.

Raman spectroscopy can also be used to determine the number of graphene layers. In some implementations, the ratio of the intensity of the 2D peak to the intensity of the G peak ($I_{2D}/I_G$) can correspond to the number of graphene layers. Specifically, if the ratio of $I_{2D}/I_G$ is greater than 2, then a deposited graphene film corresponds to single layer graphene. If the ratio of $I_{2D}/I_G$ is slightly greater than 1 or slightly less than 1 as shown in FIG. 3, then a deposited graphene film may correspond to bilayer graphene or few layer graphene, respectively.

Raman spectroscopy can also be used to determine the grain size and type of crystal in the graphene structure. In some implementations, the ratio of the intensity of the G peak to the intensity of the D peak ($I_G/I_D$) can correspond to grain size. As the ratio increases, this is an indication of increasing crystal grain size. Additionally, as the ratio decreases, this is an indication of increasing number of defects that may otherwise disrupt the planar structure of graphene.

In some implementations, the graphene film deposited on a metal surface has a thickness equal to or less than about 10 nm, equal to or less than about 5 nm, equal to or less than about 3 nm, or equal to or less than about 1 nm. The thickness of the graphene film can depend on the metal surface on which it is deposited. For example, the graphene film may be a monolayer or a few monolayers thick when deposited on copper, and so the thickness may be less than about 1 nm. The graphene film may be a single layer graphene, bilayer graphene, or few layer graphene. This can occur where the graphene film is deposited on a metal such as copper. In another example, the graphene film may be a few nanometers thick (e.g., about 2-3 nm) when deposited on other metals such as cobalt.

Figure 4:
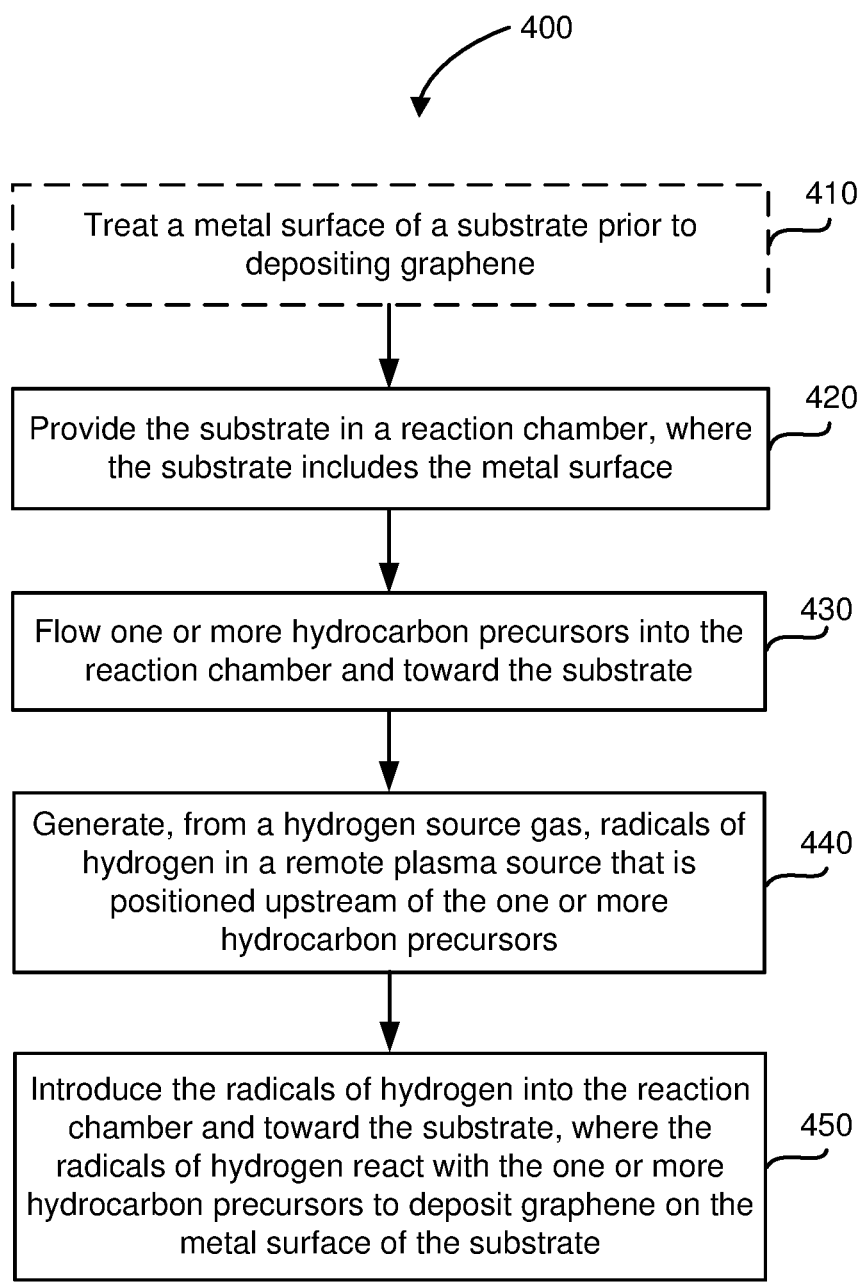
FIG. 4 illustrates a flow diagram of an example method of depositing graphene on a metal surface of a substrate according to some implementations.

FIG. 4 illustrates a flow diagram of an example method of depositing graphene on a metal surface of a substrate according to some implementations. The operations of a process 400 may be performed in different orders and/or with different, fewer, or additional operations. The operations of the process 400 may be performed using a plasma processing apparatus shown in FIG. 2. In some implementations, the operations of the process 400 may be implemented, at least in part, according to software stored in one or more non-transitory computer readable media.

At block 410 of the process 400, a metal surface of a substrate may be optionally treated prior to depositing graphene. Graphene deposition can depend on the smoothness and purity of the metal surface on which graphene is grown. Surface preparation techniques may be applied on the metal surface to polish the substrate and remove impurities. Polishing the substrate may be performed by a light etch in some implementations. Removal of impurities may be performed by a chemical treatment that removes, for example, metal oxides. Removal of impurities may additionally or alternatively involve removal of residues or contaminants from chemical mechanical planarization (CMP) processes. In some implementations, the treatment of the metal surface may occur before any diffusion barrier deposition, etch stop deposition, or hermetic barrier deposition.

In some implementations, treating the metal surface of the substrate can include exposing the metal surface to a plasma of a reducing gas species. Treatment of the metal surface can at least include removal of impurities and/or reduction of metal oxides by exposure to plasma. In some implementations, the plasma can include ions and radicals of a reducing gas species. Reducing gas species can include, for example, hydrogen gas ($H_2$), ammonia ($NH_3$), or combinations thereof. Thus, the metal surface may be treated by an $H_2$ plasma, $NH_3$ plasma, or $H_2/NH_3$ plasma. The plasma may be a direct (in-situ) plasma or remote plasma. In some implementations, exposing the metal surface to the plasma of the reducing gas species includes exposing the metal surface to a remote hydrogen plasma.

In some implementations, treating the metal surface further includes exposing the metal surface to a cyano-based radical species. In some other implementations, treating the metal surface includes exposing the metal surface to a cyano-based radical species as an alternative to exposing the metal surface to the reducing gas species. Cyano-based radical species may perform a light etch for smoothing the metal surface prior to graphene growth. Exposing the metal surface to the cyano-based radical species can occur before or after exposing the metal surface to the plasma of the reducing gas species. This can be referred to as a multi-step pretreatment process. The multi-step pretreatment process, or at least some steps of the multi-step pretreatment process, may be performed in the same or different apparatus than the plasma processing apparatus for depositing graphene. Exposing the metal surface to the cyano-based radical species can occur simultaneous with exposing the metal surface to the plasma of the reducing gas species. This can be referred to as a single-step pretreatment process. The single-step pretreatment process may be performed in the same or different apparatus than the plasma processing apparatus for depositing graphene.

In a multi-step pretreatment process, the cyano-based radical species may be generated by igniting a plasma, where the plasma may be a direct (in-situ) plasma or a remote plasma. The cyano-based radical species may be generated from a gas mixture containing at least a carbon-containing source gas and a nitrogen-containing source gas or from a gas mixture containing a precursor having a carbon-nitrogen (CN) bond. Thus, treating the metal surface can further include generating, from at least a carbon-containing source gas and a nitrogen-containing source gas or from a precursor having a carbon-nitrogen bond, plasma containing the cyano-based radical species. For example, a gas mixture of a hydrocarbon precursor, nitrogen gas, and hydrogen gas may be supplied to a plasma generator, and plasma of the gas mixture may be ignited to form the cyano-based radical species.

In a single step pretreatment process, the cyano-based radical species may be generated by activating a downstream carbon-containing precursor. Activation of the downstream carbon-containing precursor is simultaneous with surface pretreatment by the plasma of the reducing gas species. In such instances, a remote plasma source is positioned upstream of the downstream carbon-containing precursor, where the plasma of the reducing gas species is generated in the remote plasma source. In some implementations, the downstream carbon-containing precursor may be a hydrocarbon precursor. Thus, the downstream carbon-containing precursor may be chemically the same or different than the hydrocarbon precursor used in depositing graphene. In such cases, the plasma of the reducing gas species is a plasma of a reducing gas species and of a nitrogen-containing agent. For example, the reducing gas species can include hydrogen gas. The nitrogen-containing agent can include nitrogen gas. Hence, the plasma of the reducing gas species and of the nitrogen-containing agent can be a remote $H_2$ and $N_2$ plasma. The concentration of the reducing gas species may be greater than the concentration of the nitrogen-containing agent in the plasma. Without being limited by any theory, it is believed that ions/radicals of the nitrogen-containing agent interact with the downstream carbon-containing precursor to form the cyano-based radical species. The cyano-based radical species can perform a light etch for smoothing the metal surface and the plasma of the reducing gas species can reduce metal oxides to metal on the metal surface. In some other implementations, the downstream carbon-containing precursor may be precursor gas containing one or more CN bonds. Such a precursor may be activated by the plasma of the reducing gas species, where the plasma of the reducing gas species is a remote plasma generated upstream in the remote plasma source. In some instances, the plasma of the reducing gas species is a remote hydrogen plasma. Without being limited by any theory, it is believed that ions/radicals of hydrogen interact with the downstream carbon-containing precursor having one or more CN bonds to form the cyano-based radical species.

Though the treatment operation at block 410 may be described in terms of a multi-step pretreatment process and a single step pretreatment process, it will be understood that pretreatment of the metal surface is not limited to such techniques. The metal surface of the substrate may be pretreated prior to graphene deposition using any suitable surface preparation technique known in the art.

At block 420 of the process 400, the substrate is provided in a reaction chamber, where the substrate includes the metal surface. In some implementations, the substrate may already be provided in the reaction chamber during treatment at block 410. The substrate may be a semiconductor substrate used in semiconductor applications. The metal surface can include any appropriate metal such as a transition metal. For example, the metal surface can include copper, ruthenium, nickel, molybdenum, cobalt, or combinations thereof. The metal surface can serve as a catalyst for promoting graphene nucleation and growth. Deposition of graphene may be selective to the particular metal of the metal surface. Put another way, deposition of graphene may not occur on dielectric surfaces or other non-metal surfaces.

The reaction chamber may include a substrate support or pedestal for supporting the substrate. A remote plasma source may be fluidly coupled to the reaction chamber via a showerhead. The metal surface of the substrate may be facing towards the remote plasma source. A precursor gas line may be separately fluidly coupled to the reaction chamber via one or more gas outlets. The one or more gas outlets may be located downstream from the remote plasma source. The one or more gas outlets may deliver hydrocarbon precursors into the reaction chamber and the remote plasma source may generate hydrogen radicals for delivery into the reaction chamber.

At block 430 of the process 400, one or more hydrocarbon precursors are flowed into the reaction chamber and towards the substrate. Each of the one or more hydrocarbon precursors includes an alkene or alkyne group. This means that the hydrocarbon precursors include one or more unsaturated carbon bonds, such as one or more carbon-to-carbon double bonds and/or carbon-to-carbon triple bonds. Examples of hydrocarbon precursors having alkene or alkyne groups include but are not limited to toluene, benzene, ethylene, propylene, butene, pentadiene (e.g., 1,4 pentadiene), hexene, acetylene, propyne, butyne, or pentyne. In some implementations, each of the one or more hydrocarbon precursors may include a carbon chain having at least 2 carbon atoms, at least 3 carbon atoms, at least 4 carbon atoms, at least 5 carbon atoms, at least 6 carbon atoms, or at least 7 carbon atoms.

The one or more hydrocarbon precursors may flow into the reaction chamber through the one or more gas outlets fluidly coupled to the reaction chamber. The one or more gas outlets are positioned downstream from the remote plasma source. Plasma of the one or more hydrocarbon precursors is not generated in the reaction chamber or in the remote plasma source. Rather, the one or more hydrocarbon precursors are flowed into the reaction chamber independently of plasma generated in the remote plasma source.

The one or more hydrocarbon precursors are flowed towards the substrate to adsorb onto the metal surface or at least positioned in an environment adjacent to the metal surface of the substrate. In some implementations, the one or more hydrocarbon precursors are flowed into the reaction chamber simultaneous with plasma generation and plasma exposure as described at blocks 440 and 450. In some implementations, the one or more hydrocarbon precursors are flowed into the reaction chamber prior to plasma generation and plasma exposure as described at blocks 440 and 450.

In some implementations, the one or more hydrocarbon precursors are delivered with other species, notably carrier gas, into the environment adjacent to the metal surface of the substrate. Upstream from the deposition reaction surface, the one or more hydrocarbon precursors can be mixed with an inert carrier gas. Example inert carrier gases include, but are not limited to, argon (Ar) and helium (He). In some implementations, the one or more hydrocarbon precursors are delivered as a mixture of multiple hydrocarbon precursors. The multiple hydrocarbon precursors may be present in equimolar or relatively similar proportions as appropriate to form the primary backbone or matrix in the resulting graphene. In other implementations, the relative amounts of the multiple hydrocarbon precursors are substantially skewed from equimolarity.

At block 440 of the process 400, radicals of hydrogen are generated, from a hydrogen source gas, in a remote plasma source that is positioned upstream of the one or more hydrocarbon precursors. Specifically, the radicals of hydrogen are generated in a remote plasma source that is upstream from the one or more gas outlets for introducing the one or more hydrocarbon precursors into the reaction chamber. The remote plasma source may be any suitable plasma source for plasma generation, such as an inductively-coupled plasma source or capacitively-coupled plasma source. In some implementations, the hydrogen source gas is hydrogen gas ($H_2$). In some implementations, the hydrogen gas is flowed into the remote plasma source together with one or more additional gases such as helium (He). In certain embodiments, hydrogen source gas is provided in a carrier gas such as helium. As an example, hydrogen gas may be provided in a helium carrier at a concentration of about 1-25% hydrogen or 1-10% hydrogen. Therefore, in some instances, $H_2$/He plasma is generated in the remote plasma source.

At block 450 of the process 400, the radicals of hydrogen are introduced into the reaction chamber and towards the substrate, where the radicals of hydrogen react with the one or more hydrocarbon precursors to deposit graphene on the metal surface of the substrate. The radicals of hydrogen are delivered into the reaction chamber under process conditions so that excited radicals transition to relaxed radicals without recombining. Pressure, fraction of carrier gas such as helium, geometry of gas ports of the showerhead, distance between the showerhead and the one or more gas outlets, and other process conditions are configured so that the hydrogen atoms encounter the substrate as radicals in a low energy state (e.g., ground state) without recombining. In some implementations, all or substantially all of the radicals of hydrogen in an environment adjacent to the substrate are radicals of hydrogen in the ground state. That way, the substrate is exposed to remote hydrogen plasma that minimizes surface growth damage.

Once generated, the radicals of hydrogen may be in an excited energy state. For example, hydrogen in an excited energy state can have an energy of at least 10.2 eV (first excited state). Excited radicals of hydrogen may cause surface growth damage of during graphene growth. In some implementations, when an excited hydrogen radical loses its energy, or relaxes, the excited hydrogen radical may become a substantially low energy state hydrogen radical or a ground state hydrogen radical. In some implementations, process conditions may be provided so that excited hydrogen radicals lose energy or relax to form substantially low energy state or ground state hydrogen radicals. For example, the remote plasma source or associated components may be designed so that a residence time of hydrogen radicals diffusing from the remote plasma source to the substrate is greater than the energetic relaxation time of an excited hydrogen radical. The energetic relaxation time for an excited hydrogen atom radical can be about equal to or less than about $1 \times 10^{-3}$ seconds. Other process conditions that are controlled so that excited hydrogen radicals lose energy to relax to form ground state hydrogen radicals include but are not limited to pressure, gas flow rates, size and geometry of relaxation zone, size and geometry of gas ports in the showerhead, and relative concentrations of hydrogen source gas to inert carrier gas.

An environment adjacent to the metal surface of the substrate may include the one or more hydrocarbon precursors. In addition, the environment adjacent to the metal surface of the substrate may include the radicals of hydrogen in the low energy state (e.g., ground state). The environment adjacent to the metal surface of the substrate comprises the metal surface as well as a space immediately above the exposed surface of the substrate. In effect, activation of the hydrocarbon precursors by radicals of hydrogen in the low energy state may occur on the metal surface or at a distance above the metal surface of the substrate. In some implementations, the distance above the metal surface of the substrate may be up to about 100 millimeters above the metal surface of the substrate. Typically, reaction conditions in the environment adjacent to the metal surface of the substrate are generally uniform across the entire metal surface of the substrate, though some variation may be permitted.

In some implementations, all, or substantially all, or a substantial fraction of the hydrogen atom radicals can be in the ground state, e.g., at least about 90% or 95% of the hydrogen atom radicals adjacent to the metal surface of the substrate are in the ground state. As used herein, radicals of hydrogen may also be referred to as "hydrogen radicals" and "hydrogen atom radicals." A state in which a substantial fraction of hydrogen atom radicals are in the ground state can be achieved by various techniques. Some apparatuses, such as described in FIG. 2, are designed to achieve this state. The process conditions for achieving hydrogen atom radicals in the ground state may not have substantial amounts of ions, electrons, or radical species in high energy states such as states above the ground state. The presence of substantial amounts of ions or high energy radicals may cause surface growth damage on the substrate, resulting in low-quality graphene or disordered carbon growth. In some implementations, the concentration of ions in the environment adjacent to the metal surface of the substrate is no greater than about $10^7/cm^3$. Hydrogen atom radicals in the ground state may provide sufficient energy for activating the one or more hydrocarbon precursors while providing mild conditions in the environment adjacent to the metal surface to limit surface growth damage.

The one or more hydrocarbon precursors are flowed into the reaction chamber downstream from the radicals of hydrogen. The radicals of hydrogen are generated in the remote plasma source located upstream from the one or more gas outlets for introducing the one or more hydrocarbon precursors. By the time the radicals of hydrogen reach the one or more hydrocarbon precursors, the radicals of hydrogen are in a low energy state or ground state upon mixing or interacting with the one or more hydrocarbon precursors.

Without being limited by any theory, one of the more kinetically favorable reaction mechanisms in the deposition reaction includes hydrogen abstraction, which results in an activated hydrocarbon precursors. Without being limited by any theory, the hydrogen radicals in the low energy state or ground state may interact with the alkyne or alkene groups in the hydrocarbon molecule that results in the formation of activated alkanes (e.g., methane). In some instances, the hydrocarbon precursor breaks down into smaller-chain hydrocarbon molecules or radicals. Activated alkanes contain at least one carbon radical as an active site, and the active sites can react together to form carbon-to-carbon bonds in graphene. Bonding at the active sites and crosslinking can form a primary backbone or matrix in a resulting graphene film. The metal surface may act as a catalyst to promote reactions between activated hydrocarbon precursors.

The hydrocarbon precursors do not serve as passive spectators, but significantly contribute to the composition of the graphene. In some implementations, substantially all or a substantial fraction of the atoms in graphene are provided by the one or more hydrocarbon precursors, with small amounts of hydrogen or other element from the remote hydrogen plasma providing less than about 5 atomic percent or less than about 2 atomic percent of the film mass. In such cases, the low energy hydrogen atom radicals used to drive the deposition reaction do not substantially contribute to the mass of the deposited graphene.

The temperature in the environment adjacent to the metal surface of the substrate can be any suitable temperature facilitating the deposition reaction. In some implementations, the temperature in the environment adjacent to the metal surface of the substrate can be largely controlled by the temperature of a pedestal on which a substrate is supported during deposition of graphene. In some implementations, the operating temperature can be equal to or less than about 500° C., equal to or less than about 450° C., equal to or less than about 400° C., equal to or less than about 350° C., equal to or less than about 300° C., between about 200° C. and about 400° C., between about 250° C. and about 400° C., or between about 200° C. and about 300° C. Such temperatures may be suitable for semiconductor applications. In some implementations, the temperature may depend on the metal of the metal surface on which the graphene is deposited. For example, copper may be able to sustain temperatures at 400° C. or below, whereas ruthenium may be able to sustain temperatures of 450° C. or below.

The pressure in the environment adjacent to the metal surface of the substrate can be any suitable pressure to promote graphene growth in the reaction chamber. In some embodiments, the pressure can be about 10 Torr or lower, or about 5 Torr or lower. For example, the pressure can be between about 1 Torr and about 2 Torr.

Graphene may be selectively deposited on the metal surface from the reaction of radicals of hydrogen with the one or more hydrocarbon precursors provided downstream from the remote plasma source. Relatively mild reaction conditions provided by the radicals of hydrogen in a low energy state (e.g., ground state) activate the one or more hydrocarbon precursors to form carbon radicals. As such, the carbon radicals are formed outside of the remote plasma source in which plasma is generated. The amount of carbon radicals at the environment adjacent to the metal surface of the substrate may be controlled to limit having too many nucleation sites for graphene growth. Without being limited by any theory, an excess number of nucleation sites may correspond to an excess number of defects during graphene growth.

Graphene may be selectively deposited on a transition metal such as copper, ruthenium, nickel, molybdenum, cobalt, or combinations thereof. In some implementations, the metal surface includes copper. In some implementations, the graphene on the metal surface is relatively thin and may be on the order of a few monolayers thick. In some implementations, the thickness of the graphene is equal to or less than about 10 nm, equal to or less than about 5 nm, equal to or less than about 3 nm, or equal to or less than about 1 nm. The thickness of the graphene may depend on the metal surface on which it is deposited on. For example, the thickness of the graphene may be less than about 1 nm when deposited on copper. The graphene may be a single layer graphene, bilayer graphene, or few layer graphene. The Raman spectrum of the graphene may be characterized by a D peak that is negligible in intensity and having a 2D peak that is equal to or greater than a G peak. It will be understood that the intensity of the D peak will be significantly smaller than the 2D peak and the G peak.

Graphene Integration

In some implementations, the process 400 may further include annealing the graphene on the metal surface of the substrate. Annealing the graphene may occur at elevated temperatures to remove defects from the graphene crystal structure. More specifically, annealing the graphene may occur at elevated temperatures greater than the deposition temperature of graphene. This ensures formation of high-quality graphene. In some implementations, the elevated temperatures may be equal to or greater than about 200° C., equal to or greater than about 250° C., equal to or greater than about 300° C., or equal to or greater than about 400° C. For example, if graphene were deposited at a temperature less than about 250° C., then annealing may occur at an elevated temperature greater than about 250° C.

Annealing the graphene may occur at a temperature range that is between the deposition temperature of graphene and a semiconductor processing temperature limit. The semiconductor processing temperature limit may be a temperature sensitive limit in which materials (e.g., metals) in the substrate would melt or otherwise be physically damaged. For example, the temperature sensitive limit of copper is about 400° C. and the temperature sensitive limit of ruthenium is about 450° C. The elevated temperature for annealing may depend on the metal in the semiconductor substrate and the temperature limits compatible with back-end-of-line semiconductor processing. Accordingly, annealing may take place at a temperature greater than the deposition temperature of graphene but at a temperature that does not exceed the semiconductor processing temperature limit. In some implementations, the temperature range for annealing the graphene is 200° C. to 450° C., 200° C. to 400° C., 250° C. to 400° C., or 300° C. to 350° C.

Annealing the graphene may result in significant improvement in the quality of graphene with reduced defects, where the D peak is decreased, the ratio between the 2D peak and the G peak is increased, and/or the ratio between the G peak and the D peak is increased. As discussed earlier, decreasing the D peak is indicative of removal of defects in the crystal structure of graphene. Increasing the ratio between the 2D peak and the G peak is indicative of the presence of single layer graphene, bilayer graphene, or few layer graphene as opposed to disordered or amorphous carbon. The higher the ratio, the higher the crystallinity of the film. For example, annealing the graphene may increase the ratio between the 2D peak and the G peak from approximately 1:1 to approximately 2:1. Furthermore, increasing the ratio between the G peak and the D peak is indicative of increased grain size. Annealing can remove any adsorbates or defects that disrupt the planar structure of graphene while increasing grain size, thereby improving film quality. In some implementations, annealing the graphene occurs in air or inert gas atmosphere, where the inert gas atmosphere includes an inert gas such as argon (Ar), helium (He), nitrogen ($N_2$), or combinations thereof. In some implementations, annealing can take place for a duration that is equal to or less than about 30 minutes, equal to or less than about 20 minutes, equal to or less than about 10 minutes, or equal to or less than about 5 minutes.

Graphene films ordinarily do not undergo annealing operations. This is because graphene is typically deposited at high temperatures, e.g., greater than about 400° C. However, when graphene is deposited at low temperatures, e.g., between about 200° C. and about 300° C., annealing may be an important step that improves graphene film quality without exceeding a temperature sensitive limit in semiconductor processing. In other words, annealing occurs within the back-end-of-line thermal budget constraints. Therefore, annealing may be an important step in integrating graphene in semiconductor processing applications. In some implementations, annealing may occur after graphene deposition but before and/or after deposition of an etch stop, diffusion barrier, or hermetic barrier.

Graphene may lower the effective resistivity of metal lines and limit electromigration. With low temperature deposition of graphene, graphene may be integrated in a process flow for manufacturing semiconductor devices, such as in back-end-of-line (BEOL) semiconductor processing. BEOL semiconductor processing may involve providing electrical interconnection between metallization layers with one or more conductive vias. During BEOL semiconductor processing, graphene may be deposited on the metallization layers or metal lines.

Graphene may serve a number of purposes in semiconductor applications, including but not limited to serving as a diffusion barrier layer or capping layer. As a diffusion barrier layer, once via and trench etching processes are performed, graphene may be deposited on patterned metal features along at least sidewalls of the patterned metal features. In some implementations, a graphene diffusion barrier layer can replace conventional tantalum/tantalum nitride or titanium/titanium nitride barrier layers. Alternatively, as a capping layer, graphene may be deposited on a top surface of a metallization layer or metal line in a damascene or dual damascene fabrication process. Subsequent processing steps in the process flow generally entail depositing one or both of an etch stop and hermetic barrier over the metallization layer or metal line. This can be referred to as encapsulating the graphene so that the film properties of graphene may be maintained over time. In some implementations, a dielectric layer (e.g., ultralow-k dielectric) may be deposited over the etch stop and/or hermetic barrier, and a conductive via may be formed in the dielectric layer to provide electrical contact with the underlying metallization layer or metal line. However, encapsulating the graphene with one or both of an etch stop and hermetic barrier without damaging the graphene presents several challenges.

A hermetic barrier may include a dielectric material deposited over a metallization layer or metal line. Conventionally, the hermetic barrier includes a doped silicon carbide layer such as nitrogen-doped silicon carbide (SiCN) or oxygen-doped silicon carbide (SiCO). The doped silicon carbide layer may serve as both an etch stop and hermetic barrier. Such doped silicon carbide layers are often deposited by PECVD. However, depositing doped silicon carbide layers over graphene by PECVD exposes graphene to direct plasma that can damage the graphene.

An etch stop may include a dielectric material having a different etch selectivity than adjacent layers or components. Conventionally, the etch stop includes aluminum oxide ($Al_2O_3$), silicon nitride ($Si_3N_4$), silicon carbide (SiC), or doped silicon carbide (e.g., SiCN, SiCO). The etch stop may be deposited by a direct plasma technique such as PECVD or plasma-enhanced atomic layer deposition (PEALD) that can damage the graphene. Or, the etch stop may be deposited by a thermal deposition technique such as thermal CVD or thermal ALD that causes the semiconductor substrate to be exposed to elevated temperatures above a temperature sensitive limit of certain layers or components in the semiconductor substrate.

Encapsulating graphene in the present disclosure includes depositing one or both of an etch stop and hermetic barrier over graphene without damaging the graphene. The graphene may be selectively deposited over a metallization layer or conductive via in a semiconductor substrate. The graphene may be deposited at a deposition temperature that is less than a semiconductor processing temperature limit (i.e., temperature sensitive limit) so that selective deposition of graphene is compatible with BEOL semiconductor processing. The graphene may be annealed in a temperature range that is between the deposition temperature of graphene and the semiconductor processing temperature limit. In some implementations, a metal oxide such as aluminum oxide is deposited over at least graphene by a thermal-based deposition technique followed by deposition of a hermetic barrier. The metal oxide may be deposited over other layers of the semiconductor substrate in addition to being deposited over graphene. In some implementations of the present disclosure, a hermetic barrier such as nitrogen-doped silicon carbide, oxygen-doped silicon carbide, or silicon nitride is deposited over graphene by a non-direct plasma deposition technique. The non-direct plasma deposition technique may be a remote plasma CVD technique.

Figure 5A:
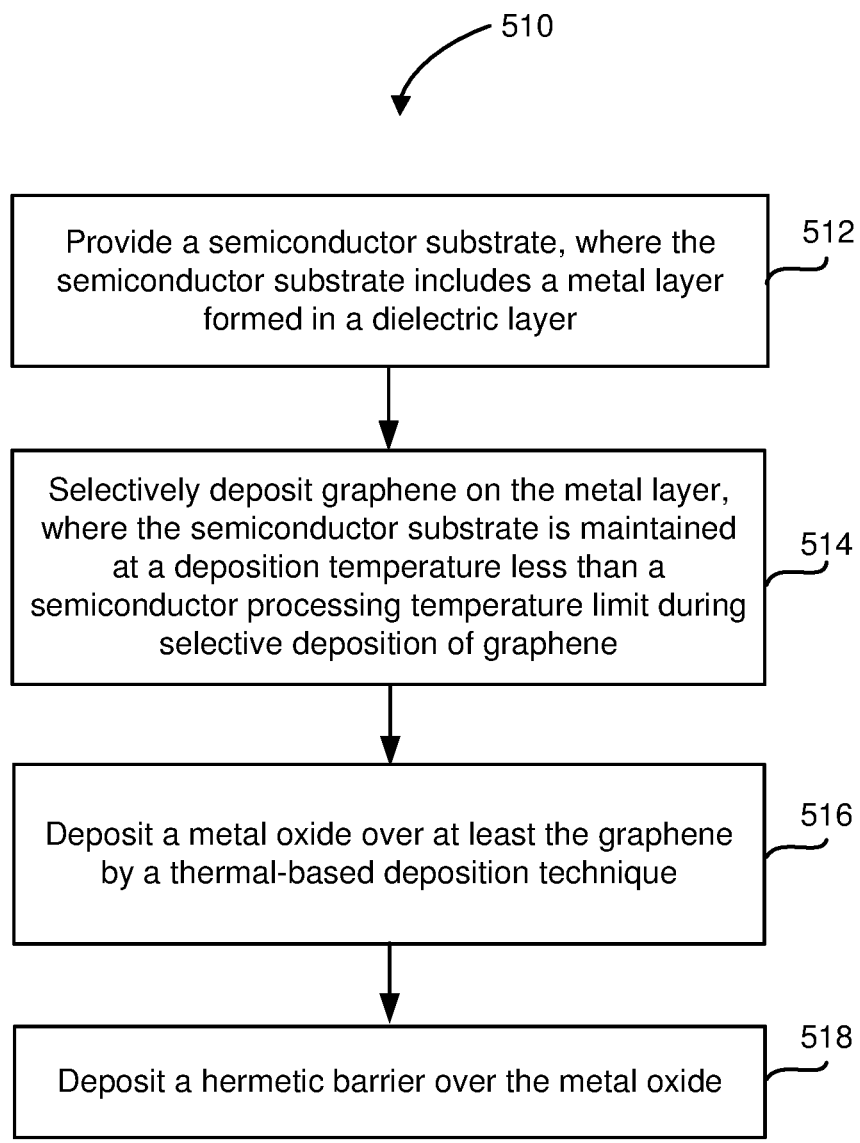
FIG. 5A illustrates a flow diagram of an example method of encapsulating graphene in a semiconductor substrate according to some implementations.

FIG. 5A illustrates a flow diagram of an example method of encapsulating graphene in a semiconductor substrate according to some implementations. The operations of a process 510 may be performed in different orders and/or with different, fewer, or additional operations. One or more operations of the process 510 may be performed using a plasma processing apparatus shown in FIG. 2. In some implementations, the operations of the process 510 may be implemented, at least in part, according to software stored in one or more non-transitory computer readable media.

At block 512 of the process 510, a semiconductor substrate is provided, where the semiconductor substrate includes a metal layer formed in a dielectric layer. The substrate may be a silicon wafer, such as a 200-mm wafer, 300-mm wafer, or a 450-mm wafer, including wafers having one or more layers of material, such as dielectric, conducting, or semiconducting materials deposited thereon. The semiconductor substrate includes a metal layer formed in a dielectric layer, where the dielectric layer may be a low-k dielectric material such as silicon oxide or doped silicon carbide. In some implementations, the metal layer may be a metallization layer in a metallization scheme, liner layer, or conductive via, where the metal layer may include any suitable electrically conductive material such as copper, ruthenium, aluminum, nickel, cobalt, tungsten, molybdenum, or combinations thereof. In some implementations, the metal layer may be treated prior to deposition of graphene on the metal layer, where treatment may serve to at least polish the metal layer or remove impurities.

Figure 6A:
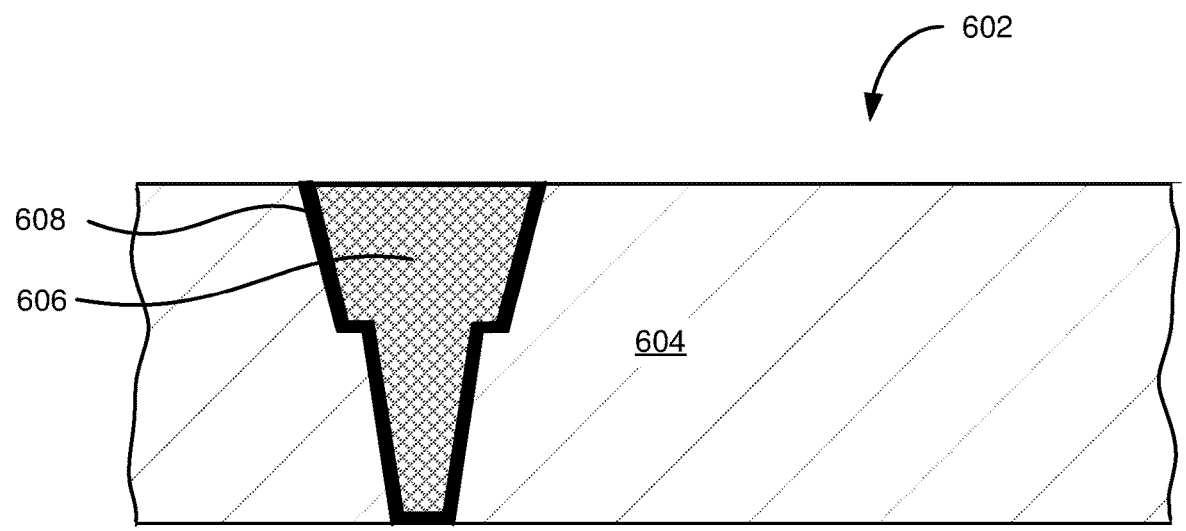
FIG. 6A illustrates a cross-sectional schematic of an example semiconductor substrate with a dual damascene structure according to some implementations.

FIG. 6A illustrates a cross-sectional schematic of an example semiconductor substrate with a dual damascene structure according to some implementations. A semiconductor substrate 602 includes a dielectric layer 604 with a metal layer 606 formed in the dielectric layer 604. In some implementations, the dielectric layer 604 includes a low-k dielectric material such as silicon oxide or doped silicon carbide. A recess may be etched through the dielectric layer 604, where the recess may be patterned and formed using a suitable lithography process. The recess may be formed according to damascene or dual damascene fabrication techniques. The recess may be filled with an electrically conductive material to form the metal layer 606, where the metal layer 606 includes a conductive via and an upper metal line over the conductive via. The conductive via may provide electrical interconnection between a lower metal line (not shown) and the upper metal line. In some implementations, the metal layer 606 includes copper, ruthenium, aluminum, nickel, cobalt, tungsten, molybdenum, or combinations thereof. A diffusion barrier layer 608 may be formed, placed, or positioned between the metal layer 606 and the dielectric layer 604. The diffusion barrier layer 608 may be conformally deposited along sidewalls of the recess. The diffusion barrier layer 608 may serve as an effective diffusion barrier layer to protect the dielectric layer 604 and underlying active devices from diffusion of metal. Thus, the diffusion barrier layer 608 may limit electromigration of metal atoms due to current and diffusion of metal atoms into the dielectric layer 604 and underlying active devices.

Returning to FIG. 5A, at block 514 of the process 510, graphene is selectively deposited on the metal layer, where the semiconductor substrate is maintained at a deposition temperature less than a semiconductor processing temperature limit during selective deposition of graphene. In some implementations, the semiconductor processing temperature limit may correspond to a temperature sensitive limit of materials or components in the semiconductor substrate. For example, the temperature sensitive limit may be about 400° C. for copper and about 450° C. for ruthenium. In some implementations, the semiconductor processing temperature limit is about 400° C. Thus, the deposition temperature may be less than about 400° C., less than about 350° C., less than about 300° C., or between about 200° C. and about 400° C.

In some implementations, the graphene may be selectively deposited on the metal layer without depositing on the dielectric layer. In some implementations, the graphene may be deposited using a remote hydrogen plasma CVD process, which is described above. Selectively depositing the graphene on the metal layer may include flowing one or more hydrocarbon precursors into a reaction chamber and towards the semiconductor substrate, generating radicals of hydrogen in a remote plasma source from a hydrogen source gas, and introducing the radicals of hydrogen into the reaction chamber and towards the semiconductor substrate, where the radicals of hydrogen react with the one or more hydrocarbon precursors to deposit the graphene on the metal layer. The one or more hydrocarbon precursors are provided downstream from the radicals of hydrogen.

Figure 6B:
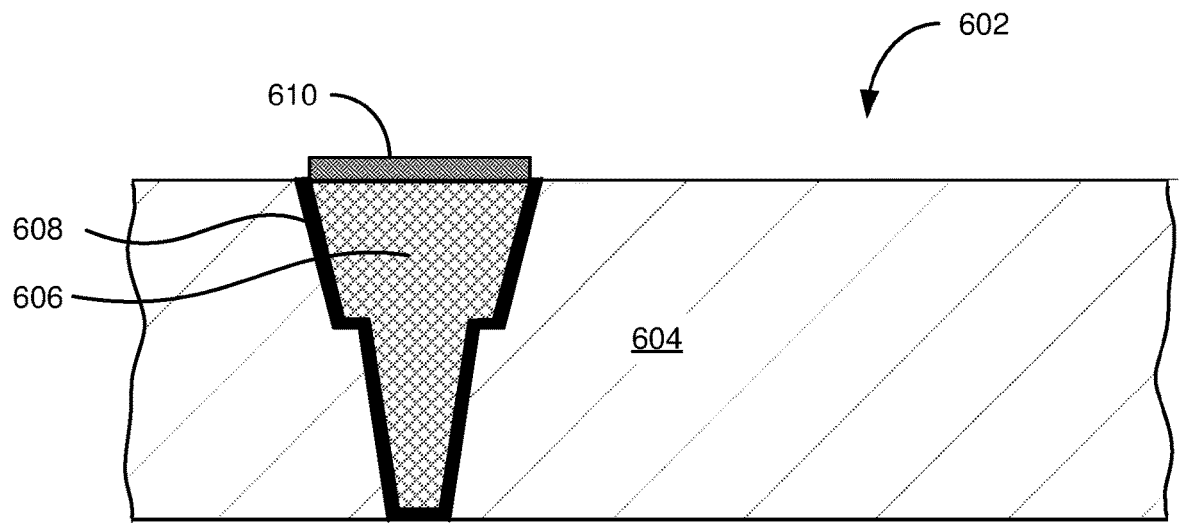
FIG. 6B illustrates a cross-sectional schematic of the example semiconductor substrate in FIG. 6A with a graphene capping layer in a dual damascene structure according to some implementations.

FIG. 6B illustrates a cross-sectional schematic of the example semiconductor substrate in FIG. 6A with a graphene capping layer in a dual damascene structure according to some implementations. The semiconductor substrate 602 includes the metal layer 606 formed in the dielectric layer 604 with the diffusion barrier layer 608 formed in between the metal layer 606 and the dielectric layer 604. The semiconductor substrate 602 further includes a graphene layer 610 formed on the metal layer 606. The graphene layer 610 is disposed on the metal layer 606 without being formed, placed, or otherwise positioned on the dielectric layer 604. The graphene layer 610 is provided on the metal layer 606 to serve as a capping layer and/or diffusion barrier layer. The graphene layer 610 may serve as an effective diffusion barrier layer to protect surrounding dielectric layers from diffusion of metal. The electrically conductive properties of the graphene layer 610 may also lower the effective resistivity of the metal layer 606 when electrically connected to a landed via (not shown) due to reduced scattering.

Returning to FIG. 5A, at block 516 of the process 510, a metal oxide is deposited over the graphene by thermal-based deposition technique. In some implementations, the metal oxide is deposited by thermal ALD or thermal CVD. The metal oxide may include aluminum oxide ($Al_2O_3$) or alumina, hafnium oxide ($HfO_2$), zirconium oxide ($ZrO_2$), yttrium oxide ($Y_2O_3$), or combinations thereof. In some implementations, the metal oxide includes aluminum oxide. The metal oxide may serve as an etch stop. The metal oxide can offer etch selectivity that is different than adjacent layers or components. The metal oxide may have a relative low dielectric constant. The metal oxide may serve as a protective layer for graphene against potentially damaging plasmas. Deposition of the metal oxide may occur prior to deposition of a hermetic barrier.

The metal oxide is deposited over the graphene in a manner that is non-damaging to the graphene. As used herein, "non-damaging" refers to processes that substantially maintains the crystalline nature of the graphene. With respect to the Raman spectrum characterizing the graphene, this means that the ratio of the 2D peak to G peak is increased or at least does not decrease by more than about 10%, and this means that the intensity of the G peak does not increase by more than about 10%, and this means that the intensity of the D peak does not increase by more than about 10%. Deposition of the metal oxide by thermal-based deposition technique avoids exposing the graphene to plasma that would otherwise damage the graphene. Deposition of the metal oxide may occur at a temperature below the semiconductor processing temperature limit.

In some implementations, deposition of the metal oxide by a thermal-based deposition technique surprisingly improves the film quality of the underlying graphene. Not only does deposition of the metal oxide avoid damaging the underlying graphene, but the deposition of the metal oxide may improve crystalline properties of the underlying graphene. This unexpectedly enhances the film quality of graphene without damaging the graphene. With respect to the Raman spectrum characterizing graphene, a D peak of the Raman spectrum may be decreased after forming the metal oxide over graphene in some implementations. In addition or in the alternative, a ratio of the 2D peak to G peak of the Raman spectrum may be increased after forming the metal oxide over graphene in some implementations.

In some implementations where the metal oxide includes aluminum oxide, the aluminum oxide may be deposited by introducing a dose of an aluminum-containing precursor to the semiconductor substrate and exposing the semiconductor substrate to an oxidant to react with the aluminum-containing precursor to thereby form aluminum oxide over graphene. In some implementations, the oxidant is water ($H_2O$) or the oxidant is a water-free oxygen source such as alcohols (e.g., methanol), hydrogen peroxide ($H_2O_2$), oxygen ($O_2$), ozone ($O_3$), or nitrous oxide ($N_2O$). In some implementations, the aluminum-containing precursor includes aluminum alkoxides, trimethyl aluminum (TMA), or aluminum trichloride ($AlCl_3$). The aluminum-containing precursor and the oxidant may be alternately provided in the reaction chamber in thermal ALD, or the aluminum-containing precursor and the oxidant may be simultaneously provided in the reaction chamber in thermal CVD.

In some implementations, the aluminum-containing precursor is trimethyl aluminum and the oxidant is a water-free oxidant such as an alcohol (e.g., methanol). By using an oxidant other than water, aluminum oxide is formed without exposing the graphene or underlying metal to water. Exposure to water may have little to no effect on the film properties of graphene, though exposure to water may adversely affect the film properties of graphene. It has been shown that deposition of aluminum oxide by thermal CVD or thermal ALD using trimethyl aluminum and a water-free oxidant such as an alcohol improves the film properties of graphene. Without being limited by any theory, aluminum atoms may replace dangling C—H bonds at grain boundaries of graphene, thereby forming C—Al bonds. Rather than having C—H bonds at grain boundaries that may be detected as crystal defects, C—Al bonds form as the aluminum oxide film grows, thereby possibly providing greater passivation and reducing effects like electron scattering in graphene.

However, it may be challenging to nucleate aluminum oxide film on graphene. This can be especially true after annealing, as high-quality graphene has few sites on which the aluminum oxide film can nucleate. In some implementations, a delay can be introduced after annealing the graphene and prior to depositing the aluminum oxide film, where the delay can ensure the surface gets back more defective sites for nucleation.

In some implementations, surface treatments can be applied to the graphene to create more defective sites for nucleation. Annealing the graphene can make nucleation more difficult in some cases. Surface treatments can include short plasma treatments that promote nucleation of metal oxide on graphene. Without being limited by any theory, the surface treatments may add hydroxyl (—OH) groups on the surface of the graphene to enable nucleation without damaging the graphene. Such plasma treatments can include, for example, exposing the surface of the graphene to plasma with one or more oxidant species. Oxidant species include but are not limited to ozone, oxygen, carbon dioxide, carbon monoxide, and water. The oxidant species may be co-flowed with another reactant such as hydrogen, nitrogen, or water. In some implementations, the plasma includes oxygen and hydrogen ($O_2$ and $H_2$ plasma). A flow rate of the oxygen may be between about 20 sccm and about 500 sccm or between about 20 sccm and about 250 sccm, and a flow rate of the hydrogen may be between about 50 sccm and about 500 sccm. In some implementations, the plasma includes oxygen and water ($O_2$ and $H_2O$ plasma). A flow rate of the oxygen may be between about 20 sccm and about 500 sccm or between about 20 sccm and about 250 sccm, and a flow rate of the water may be between about 50 sccm and about 500 sccm. In some implementations, the plasma includes oxygen and nitrogen ($O_2$ and $N_2$ plasma). A flow rate of the oxygen may be between about 20 sccm and about 500 sccm or between about 20 sccm and about 250 sccm, and a flow rate of the nitrogen may be between about 500 sccm and about 5 slm. In some implementations, a concentration of the oxidant species is equal to or less than a concentration of the co-flowed reactant. In some implementations, the plasma may further include an inert gas species such as helium or argon. A flow rate of the inert gas species may be between about 0.5 slm and about 5 slm.

The plasma treatment may be performed at relatively low temperatures to avoid damage to the graphene. In some implementations, the temperature of the plasma treatment may be between about 10° C. and about 100° C., between about 20° C. and about 50° C., or between about 50° C. and about 100° C. The plasma treatment may be performed for a relatively short duration. In some implementations, the duration of plasma exposure may be between about 1 second and about 500 seconds, between about 1 second and about 30 seconds, or between about 2 seconds and about 10 seconds. The plasma treatment may be performed at relatively low pressures. In some implementations, the pressure may be between about 0.5 Torr and about 5 Torr. The plasma treatment may be performed using a direct plasma or an indirect plasma such as a remote plasma. Remote plasma treatment may be preferable to minimize damage to the graphene. For example, the surface treatment can include exposing the graphene to a hydrogen plasma ($H_2$ plasma), $O_2$ and $H_2$ plasma, $O_2$ and $H_2O$ plasma, or $O_2$ and $N_2$ plasma. However, direct plasma treatment may be performed in some cases at low temperatures, low RF powers, and high pressures. For instance, the direct plasma treatment may be performed at a temperature less than about 100° C., at a pressure between about 3 Torr and about 15 Torr, and at an RF power between about 100 W and about 500 W. The direct plasma treatment may expose the graphene to an $O_2$ and $H_2$ plasma.

In some implementations, an ultra-thin layer can be deposited after annealing the graphene and prior to depositing the aluminum oxide film, where the ultra-thin layer can promote nucleation of the aluminum oxide film. For example, such a layer can include aluminum oxide itself deposited by CVD. Or, the ultra-thin layer can include nitrogen-doped silicon carbide, oxygen-doped silicon carbide, or silicon nitride.

In some implementations, the process 510 further includes annealing the graphene. Annealing the graphene occurs at a temperature range that is between the deposition temperature and the semiconductor processing temperature limit. For example, annealing the graphene may occur at a temperature between about 250° C. and about 400° C. Annealing the graphene may take place after depositing the graphene on the metal layer. In some implementations, annealing the graphene may take place prior to depositing the metal oxide or after depositing the metal oxide. In some implementations, annealing may be performed multiple times so that annealing takes place prior to depositing the metal oxide and after depositing the metal oxide.

Figure 7A:
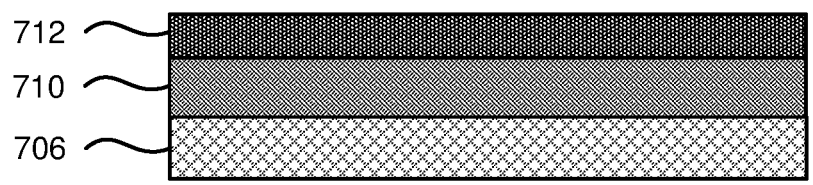
FIG. 7A illustrates a cross-sectional schematic of an example multi-layer stack including an etch stop layer deposited over graphene in a semiconductor substrate according to some implementations.

FIG. 7A illustrates a cross-sectional schematic of an example multi-layer stack including an etch stop layer deposited over graphene in a semiconductor substrate according to some implementations. The multi-layer stack includes a graphene layer 710 over a metal layer 706, and an etch stop layer 712 over the graphene layer 710. The multi-layer stack in FIG. 7A may be incorporated in a semiconductor substrate 602 of FIG. 6B, where the metal layer 606 corresponds to the metal layer 706 and the graphene layer 610 corresponds to the graphene layer 710. Thus, the metal layer 706 may be formed in a recess of a dual damascene structure and the graphene layer 710 may be selectively deposited on the metal layer 706 at a low deposition temperature compatible with BEOL semiconductor processing. The etch stop layer 712 may be subsequently deposited over the graphene layer 710, where the etch stop layer 712 may include a metal oxide such as aluminum oxide. The etch stop layer 712 may be deposited under conditions that is non-damaging to the graphene layer 710 or under conditions that improve film quality of the graphene layer 710. In some implementations, a thickness of the etch stop layer 712 is between about 0.5 nm and about 5 nm.

Returning to FIG. 5A, at block 518 of the process 510, a hermetic barrier is deposited over the metal oxide. In some implementations, the metal oxide serves as an etch stop but is insufficient for serving as a hermetic barrier. Examples of hermetic barriers include doped silicon carbides such as nitrogen-doped silicon carbide (SiCN) or oxygen-doped silicon carbide (SiCO). Another example of hermetic barriers includes silicon nitride. The hermetic barrier may provide protection to the graphene by sealing the graphene from water, oxygen, and other chemistries in a surrounding environment that may adversely affect the film properties of graphene. The hermetic barrier encapsulates the graphene to ensure that the graphene maintains its film properties over time.

The hermetic barrier may be deposited by any suitable deposition technique including non-direct and direct plasma deposition techniques. The metal oxide over the graphene may protect the graphene from exposure to damaging plasmas. Thus, the hermetic barrier may be deposited using PECVD or PEALD, where the plasma may be generated in-situ or remotely.

In some implementations, the hermetic barrier is deposited by PECVD. Deposition by PECVD represents an example direct plasma deposition technique. In some implementations, the hermetic barrier is deposited by a remote plasma CVD technique. Remote plasma CVD represents an example non-direct plasma deposition technique. In a remote plasma CVD technique, a silicon-containing precursor is flowed to the semiconductor substrate, radicals are generated in a remote plasma source from a source gas, and the radicals are introduced into a reaction chamber and flowed towards the semiconductor substrate to react with the silicon-containing precursor in the reaction chamber. In some implementations, the source gas includes a hydrogen source gas ($H_2$) and the radicals include hydrogen radicals. The radicals are provided under processing conditions so that the radicals are in a substantially low energy state or ground state when reacting with the silicon-containing precursor in an environment adjacent to the semiconductor substrate. The radicals are generated in the remote plasma source upstream from the silicon-containing precursor. The silicon-containing precursor contains silicon-hydrogen bond(s) and/or silicon-silicon bond(s), and silicon-carbon bond(s), silicon-nitrogen bond(s), and/or silicon-oxygen bond(s). In some implementations, the silicon-containing precursor does not contain carbon-oxygen bonds or carbon-nitrogen bonds. By having the radicals generated upstream from the silicon-containing precursor and in a remote plasma source, the semiconductor substrate is not directly exposed to plasma.

Figure 7B:
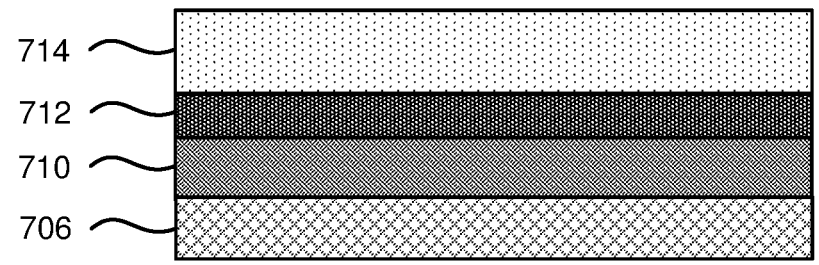
FIG. 7B illustrates a cross-sectional schematic of an example multi-layer stack including a hermetic barrier deposited over an etch stop layer and graphene in a semiconductor substrate according to some implementations.

FIG. 7B illustrates a cross-sectional schematic of an example multi-layer stack including a hermetic barrier deposited over an etch stop layer and graphene in a semiconductor substrate according to some implementations. The multi-layer stack includes a graphene layer 710 over a metal layer 706, and an etch stop layer 712 over the graphene layer 710 as shown in FIG. 7A. The multi-layer stack in FIG. 7B further includes a hermetic barrier 714 over the etch stop layer 712. The multi-layer stack in FIG. 7B may be incorporated in a semiconductor substrate 602 of FIG. 6B, where the metal layer 606 corresponds to the metal layer 706 and the graphene layer 610 corresponds to the graphene layer 710. In some implementations, the hermetic barrier 714 includes a doped silicon carbide such as nitrogen-doped silicon carbide or oxygen-doped silicon carbide. In some other implementations, the hermetic barrier 714 includes silicon nitride. The hermetic barrier 714 may be deposited by any suitable deposition technique including non-direct and direct plasma deposition techniques. Where the hermetic barrier 714 includes silicon nitride, the source gas can include nitrogen ($N_2$) and hydrogen ($H_2$) or ammonia ($NH_3$). In some implementations, a thickness of the hermetic barrier 714 is between about 0.5 nm and about 10 nm or between about 1 nm and about 5 nm.

Figure 5B:
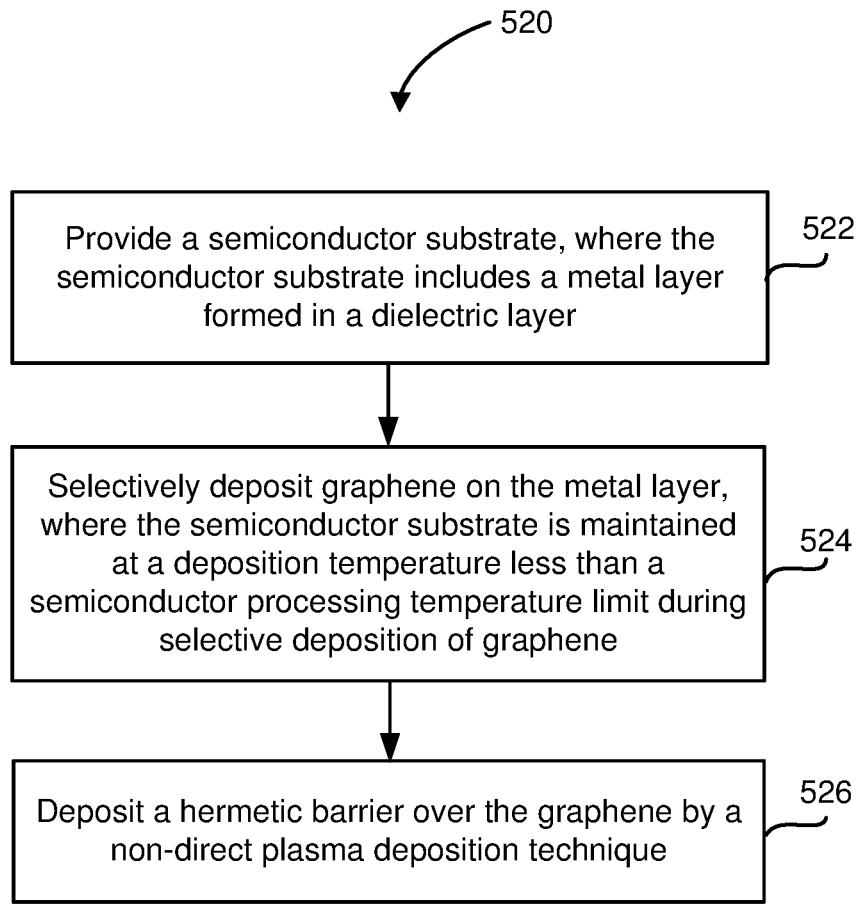
FIG. 5B illustrates a flow diagram of an example method of encapsulating graphene in a semiconductor substrate according to some other implementations.

FIG. 5B illustrates a flow diagram of an example method of encapsulating graphene in a semiconductor substrate according to some other implementations. The operations of a process 520 may be performed in different orders and/or with different, fewer, or additional operations. One or more operations of the process 520 may be performed using a plasma processing apparatus shown in FIG. 2. In some implementations, the operations of the process 520 may be implemented, at least in part, according to software stored in one or more non-transitory computer readable media.

At block 522 of the process 520, a semiconductor substrate is provided, where the semiconductor substrate includes a metal layer formed in a dielectric layer. The substrate may be a silicon wafer, such as a 200-mm wafer, 300-mm wafer, or a 450-mm wafer, including wafers having one or more layers of material, such as dielectric, conducting, or semiconducting materials deposited thereon. The semiconductor substrate includes a metal layer formed in a dielectric layer, where the dielectric layer may be a low-k dielectric material such as silicon oxide or doped silicon carbide. In some implementations, the metal layer may be a metallization layer in a metallization scheme, liner layer, or conductive via, where the metal layer may include any suitable electrically conductive material such as copper, ruthenium, aluminum, nickel, cobalt, tungsten, molybdenum, or combinations thereof. In some implementations, the metal layer may be treated prior to deposition of graphene on the metal layer, where treatment may serve to at least polish the metal layer or remove impurities.

At block 524 of the process 520, graphene is selectively deposited on the metal layer, where the semiconductor substrate is maintained at a deposition temperature less than a semiconductor processing temperature limit during selective deposition of graphene. In some implementations, the semiconductor processing temperature limit may correspond to a temperature sensitive limit of materials or components in the semiconductor substrate. For example, the temperature sensitive limit may be about 400° C. for copper and about 450° C. for ruthenium. In some implementations, the semiconductor processing temperature limit is about 400° C. Thus, the deposition temperature may be less than about 400° C., less than about 350° C., less than about 300° C., or between about 200° C. and about 400° C.

In some implementations, the graphene may be selectively deposited on the metal layer without depositing on the dielectric layer. In some implementations, the graphene may be deposited using a remote hydrogen plasma CVD process, which is described above. Selectively depositing the graphene on the metal layer may include flowing one or more hydrocarbon precursors into a reaction chamber and towards the semiconductor substrate, generating radicals of hydrogen in a remote plasma source from a hydrogen source gas, and introducing the radicals of hydrogen into the reaction chamber and towards the semiconductor substrate, where the radicals of hydrogen react with the one or more hydrocarbon precursors to deposit the graphene on the metal layer. The one or more hydrocarbon precursors are provided downstream from the radicals of hydrogen.

At block 526 of the process 520, a hermetic barrier is deposited over the graphene by a non-direct plasma deposition technique. Exposing the graphene to direct or in-situ plasmas destroy the graphene crystalline structure to form disorganized or amorphous carbon. Exposing the graphene to non-direct or remote plasmas maintains the crystalline nature of the graphene. In other words, the hermetic barrier may be deposited using a non-direct plasma deposition technique under conditions that is non-damaging to the underlying graphene. In some implementations, the hermetic barrier includes a doped silicon carbide such as nitrogen-doped silicon carbide or oxygen-doped silicon carbide. In some other implementations, the hermetic barrier includes silicon nitride. The hermetic barrier may serve as an etch stop and as a hermetic barrier.

In some implementations, the hermetic barrier is deposited by a remote plasma CVD technique. In a remote plasma CVD technique, a silicon-containing precursor is flowed to the semiconductor substrate in a reaction chamber, radicals are generated in a remote plasma source from a source gas, and the radicals are introduced into a reaction chamber and flowed to the semiconductor substrate to react with the silicon-containing precursor in the reaction chamber, thereby forming the hermetic barrier. In some implementations, the source gas includes hydrogen gas ($H_2$) and the radicals include hydrogen radicals. The radicals are provided under processing conditions so that the radicals are in a substantially low energy state or ground state when reacting with the silicon-containing precursor in an environment adjacent to the semiconductor substrate. The radicals are generated in the remote plasma source upstream from the silicon-containing precursor. The silicon-containing precursor contains silicon-hydrogen bond(s) and/or silicon-silicon bond(s), and silicon-carbon bond(s), silicon-nitrogen bond(s), and/or silicon-oxygen bond(s). In some implementations, the silicon-containing precursor does not contain carbon-oxygen bonds or carbon-nitrogen bonds. By having the radicals generated upstream from the silicon-containing precursor and in a remote plasma source, the semiconductor substrate is not directly exposed to plasma.

In some implementations, the process 520 further includes annealing the graphene. Annealing the graphene occurs at a temperature range that is between the deposition temperature and the semiconductor processing temperature limit. For example, annealing the graphene may occur at a temperature between about 250° C. and about 400° C. Annealing the graphene may take place after depositing the graphene on the metal layer. In some implementations, annealing the graphene may occur prior to depositing the hermetic barrier or after depositing the hermetic barrier. In some implementations, annealing may be performed multiple times so that annealing occurs prior to depositing the hermetic barrier and after depositing the hermetic barrier.

Figure 7C:
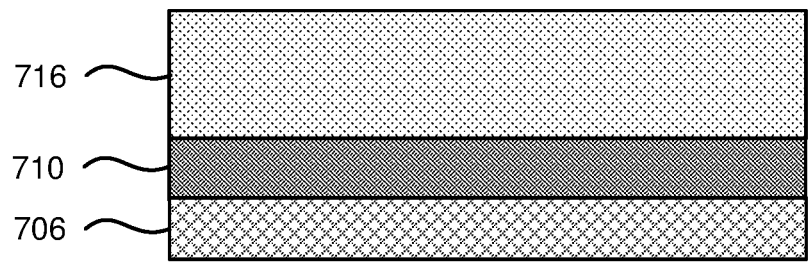
FIG. 7C illustrates a cross-sectional schematic of an example multi-layer stack including a hermetic barrier deposited over graphene in a semiconductor substrate according to some implementations.

FIG. 7C illustrates a cross-sectional schematic of an example multi-layer stack including a hermetic barrier deposited over graphene in a semiconductor substrate according to some implementations. The multi-layer stack includes a graphene layer 710 over a metal layer 706, and a hermetic barrier layer 716 over the graphene layer 710. The multi-layer stack in FIG. 7C may be incorporated in a semiconductor substrate 602 of FIG. 6B, where the metal layer 606 corresponds to the metal layer 706 and the graphene layer 610 corresponds to the graphene layer 710. In some implementations, the hermetic barrier layer 716 includes a doped silicon carbide such as nitrogen-doped silicon carbide or oxygen-doped silicon carbide. In some other implementations, the hermetic barrier layer 716 includes silicon nitride. The hermetic barrier layer 716 may be deposited by a non-direct plasma deposition technique such as remote plasma CVD. That way, the graphene layer 710 is not directly exposed to damaging plasmas during encapsulation. Where the hermetic barrier layer 716 includes silicon nitride, the source gas can include $N_2$ and $H_2$ or $NH_3$. In some implementations, a thickness of the hermetic barrier layer 716 is between about 0.5 nm and about 20 nm or between about 1 nm and about 6 nm.

Figure 5C:
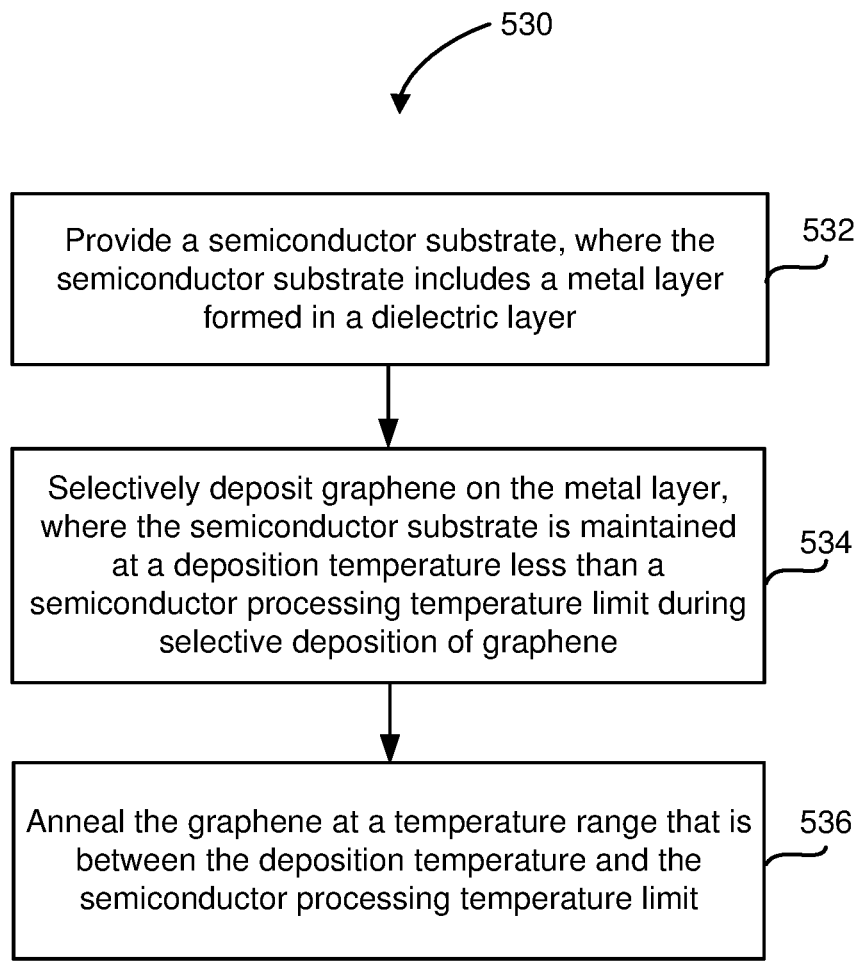
FIG. 5C illustrates a flow diagram of an example method of treating graphene in a semiconductor substrate according to some implementations.

FIG. 5C illustrates a flow diagram of an example method of treating graphene in a semiconductor substrate according to some implementations. The operations of a process 530 may be performed in different orders and/or with different, fewer, or additional operations. One or more operations of the process 530 may be performed using a plasma processing apparatus shown in FIG. 2. In some implementations, the operations of the process 530 may be implemented, at least in part, according to software stored in one or more non-transitory computer readable media.

At block 532 of the process 530, a semiconductor substrate is provided, where the semiconductor substrate includes a metal layer formed in a dielectric layer. The substrate may be a silicon wafer, such as a 200-mm wafer, 300-mm wafer, or a 450-mm wafer, including wafers having one or more layers of material, such as dielectric, conducting, or semiconducting materials deposited thereon. The semiconductor substrate includes a metal layer formed in a dielectric layer, where the dielectric layer may be a low-k dielectric material such as silicon oxide or doped silicon carbide. In some implementations, the metal layer may be a metallization layer in a metallization scheme, liner layer, or conductive via, where the metal layer may include any suitable electrically conductive material such as copper, ruthenium, aluminum, nickel, cobalt, tungsten, molybdenum, or combinations thereof. In some implementations, the metal layer may be treated prior to deposition of graphene on the metal layer, where treatment may serve to at least polish the metal layer or remove impurities.

At block 534 of the process 530, graphene is selectively deposited on the metal layer, where the semiconductor substrate is maintained at a deposition temperature less than a semiconductor processing temperature limit during selective deposition of graphene. In some implementations, the semiconductor processing temperature limit may correspond to a temperature sensitive limit of materials or components in the semiconductor substrate. For example, the temperature sensitive limit may be about 400° C. for copper and about 450° C. for ruthenium. In some implementations, the semiconductor processing temperature limit is about 400° C. Thus, the deposition temperature may be less than about 400° C., less than about 350° C., less than about 300° C., or between about 200° C. and about 400° C.

In some implementations, the graphene may be selectively deposited on the metal layer without depositing on the dielectric layer. In some implementations, the graphene may be deposited using a remote hydrogen plasma CVD process, which is described above. Selectively depositing the graphene on the metal layer may include flowing one or more hydrocarbon precursors into a reaction chamber and towards the semiconductor substrate, generating radicals of hydrogen in a remote plasma source from a hydrogen source gas, and introducing the radicals of hydrogen into the reaction chamber and towards the semiconductor substrate, where the radicals of hydrogen react with the one or more hydrocarbon precursors to deposit the graphene on the metal layer. The one or more hydrocarbon precursors are provided downstream from the radicals of hydrogen.

At block 536 of the process 530, the graphene is annealed at a temperature range that is between the deposition temperature and the semiconductor processing temperature limit. That way, annealing occurs within a temperature sensitive limit that is compatible with BEOL thermal budget constraints. In some implementations, the temperature range for annealing the graphene is 200° C. to 450° C., 200° C. to 400° C., 250° C. to 400° C., or 300° C. to 350° C. Annealing the graphene may result in significant improvement in the quality of graphene with reduced defects. In a Raman spectrum characterizing graphene, the D peak is decreased or eliminated after annealing. In addition or in the alternative, a ratio of the 2D peak to the G peak is increased after annealing. In addition or in the alternative, a ratio of the G peak to the D peak is increased after annealing. Without being limited by any theory, annealing can remove any adsorbates or defects that disrupt the planar structure of graphene while increasing grain size, thereby improving film quality. In some implementations, annealing the graphene occurs in air or inert gas atmosphere, where the inert gas atmosphere includes an inert gas such as argon, helium, nitrogen, or combinations thereof. In some implementations, annealing can take place for a duration that is equal to or less than about 30 minutes, equal to or less than about 20 minutes, equal to or less than about 10 minutes, or equal to or less than about 5 minutes.

In some implementations, the process 530 further includes depositing an etch stop over the graphene. The etch stop may include a metal oxide such as aluminum oxide. In some implementations, the process 530 further includes depositing a hermetic barrier over the graphene. The hermetic barrier may include a doped silicon carbide such as nitrogen-doped silicon carbide or oxygen-doped silicon carbide. Alternatively, the hermetic barrier may include silicon nitride. The hermetic barrier may be deposited by non-direct or direct plasma deposition techniques. Where the hermetic barrier includes silicon nitride, the source gas can include $N_2$ and $H_2$ or $NH_3$.

Figure 5D:
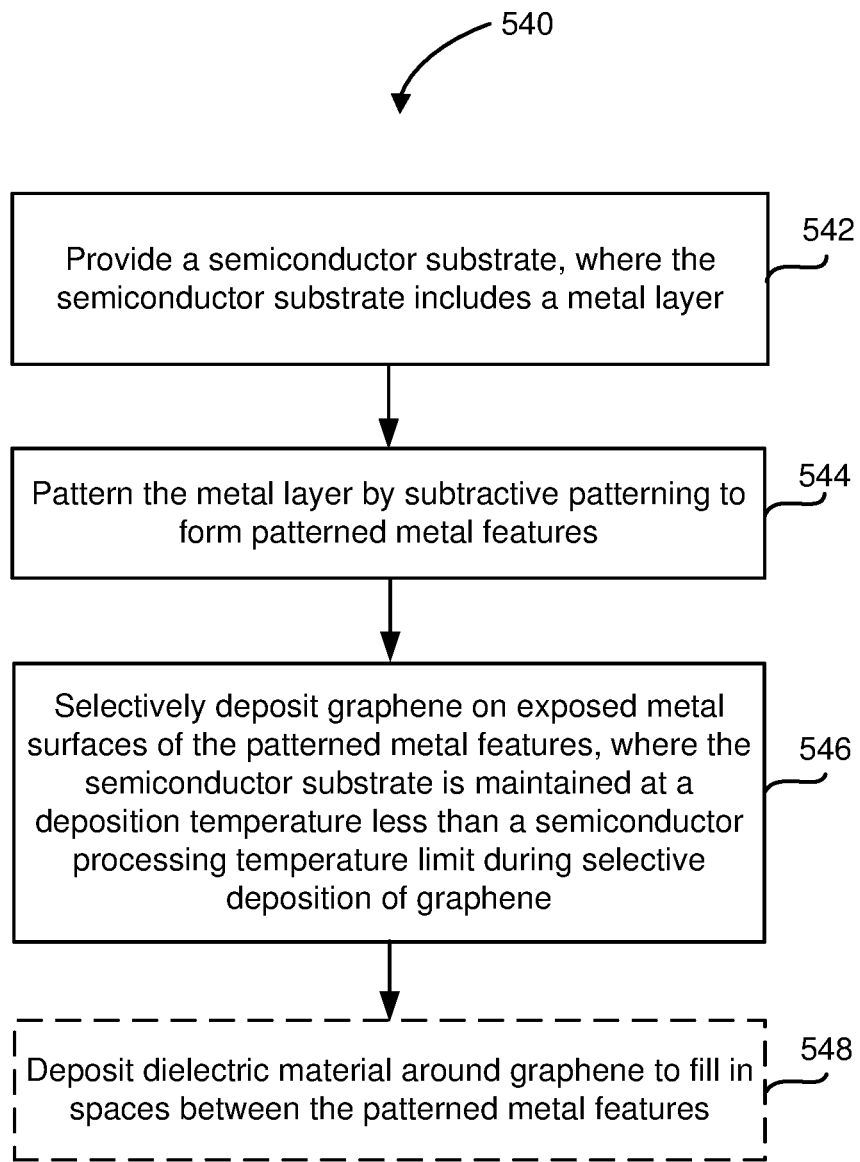
FIG. 5D illustrates a flow diagram of an example method of depositing graphene on a patterned metal layer formed by subtractive patterning in a semiconductor substrate according to some implementations.

FIG. 5D illustrates a flow diagram of an example method of depositing graphene on a patterned metal layer formed by subtractive patterning in a semiconductor substrate according to some implementations. The operations of a process 540 may be performed in different orders and/or with different, fewer, or additional operations. One or more operations of the process 540 may be performed using a plasma processing apparatus shown in FIG. 2. In some implementations, the operations of the process 540 may be implemented, at least in part, according to software stored in one or more non-transitory computer readable media.

At block 542 of the process 540, a semiconductor substrate is provided, where the semiconductor substrate includes a metal layer. The substrate may be a silicon wafer, such as a 200-mm wafer, 300-mm wafer, or a 450-mm wafer, including wafers having one or more layers of material, such as dielectric, conducting, or semiconducting materials deposited thereon. The metal layer may be deposited using any suitable deposition process such as PCD, CVD, PECVD, ALD, or electrodeposition. The metal layer may include any suitable metal that may be patterned by subtractive patterning. In some implementations, the metal can include but is not limited to molybdenum, ruthenium, tungsten, aluminum, or copper.

At block 544 of the process 540, the metal layer is patterned by subtractive patterning to form patterned metal features. In some implementations, a mask layer may be deposited over the metal layer, and the mask layer may be patterned using lithography to form patterned mask features over the metal layer. The underlying metal layer may be patterned and "cut" according to the patterned mask features using a suitable etch process, thereby forming patterned metal features on the semiconductor substrate from the metal layer.

At block 546 of the process 540, graphene is selectively deposited on exposed metal surfaces of the patterned metal features, where the semiconductor substrate is maintained at a deposition temperature less than a semiconductor processing temperature limit during selective deposition of graphene. In some implementations, the semiconductor processing temperature limit may correspond to a temperature sensitive limit of materials or components in the semiconductor substrate. For example, the temperature sensitive limit may be about 400° C. for copper and about 450° C. for ruthenium. In some implementations, the semiconductor processing temperature limit is about 400° C. Thus, the deposition temperature may be less than about 400° C., less than about 350° C., less than about 300° C., or between about 200° C. and about 400° C.

The graphene may be selectively deposited on sidewalls and top surfaces of the patterned metal features. As a result, the graphene may serve as a diffusion barrier layer around the patterned metal features to limit diffusion of metal atoms into surrounding dielectric material. Rather than depositing a conventional diffusion barrier layer made of materials such as titanium nitride (TiN), titanium (Ti), tantalum nitride (TaN), tantalum (Ta), or combinations thereof, graphene can replace such conventional diffusion barrier layers. A graphene diffusion barrier layer is similar to a graphene capping layer discussed above except that the graphene diffusion barrier layer is deposited on sidewalls and top surfaces of patterned metal features formed by subtractive patterning.

In some implementations, the graphene may be selectively deposited on exposed surfaces of the patterned metal features without depositing on a dielectric layer. In some implementations, the graphene may be deposited using a remote hydrogen plasma CVD process, which is described above. Selectively depositing the graphene on the patterned metal features may include flowing one or more hydrocarbon precursors into a reaction chamber and towards the semiconductor substrate, generating radicals of hydrogen in a remote plasma source from a hydrogen source gas, and introducing the radicals of hydrogen into the reaction chamber and towards the semiconductor substrate, where the radicals of hydrogen react with the one or more hydrocarbon precursors to deposit the graphene on the patterned metal features. The one or more hydrocarbon precursors are provided downstream from the radicals of hydrogen.

At block 548 of the process 540, dielectric material is optionally deposited around the graphene to fill in spaces between the patterned metal features. Thus, the dielectric material can surround the patterned metal features. In some implementations, the dielectric material is a low-k dielectric material, where a low-k dielectric material can have a dielectric constant equal to or less than about 5.0, which may be equal to or less than a dielectric constant of silicon oxide (about 4.2). Low-k dielectric materials may include a fluorine-doped or carbon-doped silicon oxide or an organic-containing low-k material such as an organosilicate glass (OSG). In some implementations, after the dielectric material is deposited around the graphene and the patterned metal features, a planarization process may be performed such as chemical mechanical polishing (CMP) or blanket etchback.

The graphene may be a graphene diffusion barrier layer formed between the dielectric material and the patterned metal features. The graphene may be deposited not only as a graphene capping layer on top surfaces of patterned metal features as discussed above, but deposited along sidewalls of patterned metal features to serve as a graphene diffusion barrier layer.

Figure 8:
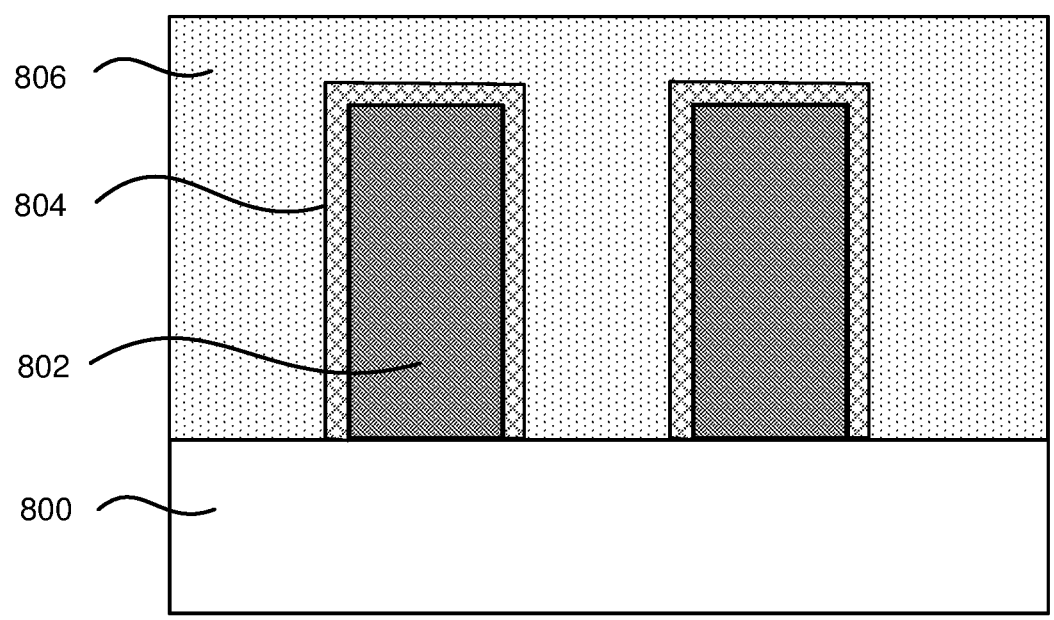
FIG. 8 illustrates a cross-sectional schematic of an example semiconductor substrate including patterned metal features formed by subtractive patterning with graphene deposited on sidewalls and top surfaces of the patterned metal features according to some implementations.

FIG. 8 illustrates a cross-sectional schematic of an example semiconductor substrate including patterned metal features formed by subtractive patterning with graphene deposited on sidewalls and top surfaces of the patterned metal features according to some implementations. A semiconductor substrate 800 includes a plurality of patterned metal features 802 formed by subtractive patterning. In some implementations, the patterned metal features 802 may include a metal such as molybdenum, ruthenium, tungsten, aluminum, or copper. A thin layer of graphene 804 is selectively deposited on sidewalls and top surfaces of the patterned metal features 802, where the thin layer of graphene 804 is selectively deposited on the metal without depositing on other materials, layers, or components of the semiconductor substrate 800. A low-k dielectric material 806 surrounds the thin layer of graphene 804 and fills spaces between patterned metal features 802. The thin layer of graphene 804 may serve as a diffusion barrier layer between the patterned metal features and the low-k dielectric material 806 to limit diffusion of metal into the low-k dielectric material. In some implementations, a thickness of the thin layer of graphene 804 is between about 0.5 nm and about 10 nm, or between about 1 nm and about 6 nm.

Data

Figure 9A:
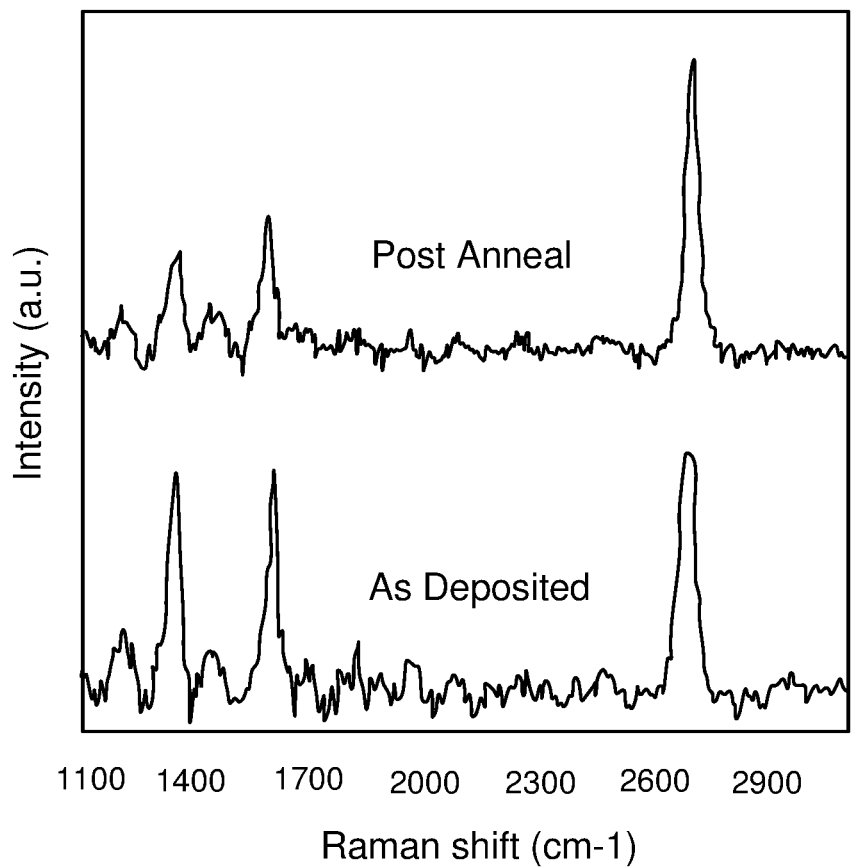
FIG. 9A illustrates a graph comparing Raman spectra of as-deposited graphene and post-anneal graphene.

FIG. 9A illustrates a graph comparing Raman spectra of as-deposited graphene and post-anneal graphene. As shown in FIG. 9A, the Raman spectrum of as-deposited graphene shows a substantial D peak indicative of defects (e.g., vacancies) that likely disrupts the planar structure of the graphene. Without being limited by any theory, the defects may be a result of OH and H groups in the graphene that disrupt the sp2 hybridization of the graphene. Furthermore, the ratio of the 2D peak to the G peak is approximately 1:1, which can be indicative of amorphous carbon in a graphene structure. However, after annealing the graphene, the D peak is significantly decreased and the ratio of the 2D peak to the G peak is increased to greater than 2:1. This shows that annealing the graphene leads to removal of defects and greater crystallinity in multi-layer or monolayer graphene.

Figure 9B:
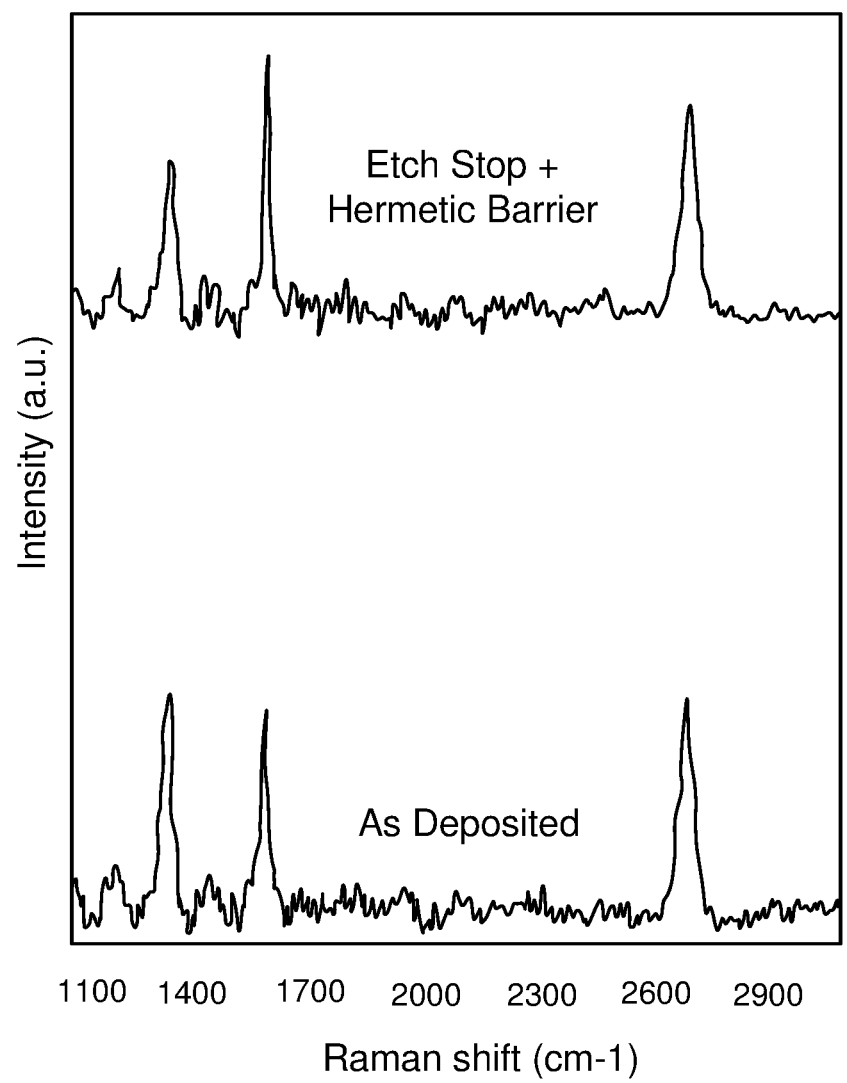
FIG. 9B illustrates a graph comparing Raman spectra of as-deposited graphene with graphene following deposition of an etch stop layer and hermetic barrier.

FIG. 9B illustrates a graph comparing Raman spectra of as-deposited graphene with graphene after deposition of an etch stop layer and deposition of a hermetic barrier. The Raman spectrum characterizing as-deposited graphene reveals a D peak that is substantial as well as a ratio of the 2D peak to the G peak that is approximately 1:1. After depositing an etch stop layer and a hermetic barrier layer, the D peak decreased and a ratio of the 2D peak to the G peak remained substantially the same. The ratio of the 2D peak to the G peak is approximately 1:1. Thus, deposition of the etch stop layer and the hermetic barrier layer not only avoided damage to the graphene structure but revealed improvements to the underlying graphene structure.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of encapsulating graphene in a semiconductor substrate, the method comprising:
providing a semiconductor substrate, wherein the semiconductor substrate includes a metal layer formed in a dielectric layer;
selectively depositing graphene on the metal layer, wherein the semiconductor substrate is maintained at a deposition temperature less than a semiconductor processing temperature limit during selective deposition of graphene;
depositing a metal oxide over at least the graphene by a thermal-based deposition technique; and
depositing a hermetic barrier over the metal oxide.

2. The method of claim 1, further comprising:
treating a surface of the graphene prior to depositing the metal oxide by exposure to plasma.

3. The method of claim 2, wherein the plasma includes an $H_2$ and $O_2$ plasma, $H_2O$ and $O_2$ plasma, or $N_2$ and $O_2$ plasma.

4. The method of claim 3, wherein a concentration of an oxidant species in the plasma is equal to or less than a concentration of a co-flowed reactant in the plasma.

5. The method of claim 2, wherein exposure to plasma occurs at a temperature between about 10° C. and about 100° C., at a pressure between about 0.5 Torr and about 5 Torr, and for a duration between about 1 second and about 10 seconds.

6. The method of claim 1, wherein the metal oxide comprises aluminum oxide, hafnium oxide, zirconium oxide, yttrium oxide, or combinations thereof.

7. The method of claim 6, wherein the metal oxide comprises aluminum oxide.

8. The method of claim 7, wherein depositing the metal oxide over at least graphene comprises:
introducing a dose of an aluminum-containing precursor to the semiconductor substrate; and
exposing the semiconductor substrate to an oxidant to react with the aluminum-containing precursor and form aluminum oxide over graphene.

9. The method of claim 8, wherein the aluminum-containing precursor is trimethyl aluminum (TMA) and the oxidant is a water-free oxidant.

10. The method of claim 8, wherein a D peak of a Raman spectrum characterizing graphene is decreased after forming aluminum oxide over graphene.

11. The method of claim 1, wherein the hermetic barrier comprises a nitrogen-doped silicon carbide, oxygen-doped silicon carbide, or silicon nitride.

12. The method of claim 1, wherein selectively depositing graphene on the metal layer comprises:
flowing one or more hydrocarbon precursors into a reaction chamber and towards the semiconductor substrate;

generating, from a hydrogen source gas, radicals of hydrogen in a remote plasma source; and introducing the radicals of hydrogen into the reaction chamber and towards the semiconductor substrate, wherein the radicals of hydrogen react with the one or more hydrocarbon precursors to deposit graphene on the metal layer.

13. The method of claim 1, wherein the metal layer includes copper, ruthenium, aluminum, nickel, cobalt, tungsten, molybdenum, or combinations thereof.

14. A method of encapsulating graphene in a semiconductor substrate, the method comprising:

providing a semiconductor substrate, wherein the semiconductor substrate includes a metal layer formed in a dielectric layer;

selectively depositing graphene on the metal layer, wherein the semiconductor substrate is maintained at a deposition temperature less than a semiconductor processing temperature limit during selective deposition of graphene; and depositing a hermetic barrier over the graphene by a non-direct plasma deposition technique.

15. The method of claim 14, further comprising:

treating a surface of the graphene prior to depositing the metal oxide by exposure to plasma.

16. The method of claim 15, wherein the plasma includes an $H_2$ and $O_2$ plasma, $H_2O$ and $O_2$ plasma, or $N_2$ and $O_2$ plasma.

17. The method of claim 14, wherein depositing the hermetic barrier comprises:

flowing a silicon-containing precursor to the semiconductor substrate in a reaction chamber;

generating, from a source gas, radicals in a remote plasma source that are generated upstream of the silicon-containing precursor; and introducing the radicals into the reaction chamber and to the semiconductor substrate, wherein the radicals react with the silicon-containing precursor to form the hermetic barrier over the graphene.

18. The method of claim 14, wherein the hermetic barrier includes nitrogen-doped silicon carbide, oxygen-doped silicon carbide, or silicon nitride.

19. The method of claim 14, further comprising:

depositing an etch stop by a thermal-based deposition technique over the graphene prior to depositing the hermetic barrier.

20. The method of claim 14, wherein selectively depositing graphene on the metal layer comprises:

flowing one or more hydrocarbon precursors into a reaction chamber and towards the semiconductor substrate;

generating, from a hydrogen source gas, radicals of hydrogen in a remote plasma source; and introducing the radicals of hydrogen into the reaction chamber and towards the semiconductor substrate, wherein the radicals of hydrogen react with the one or more hydrocarbon precursors to deposit graphene on the metal layer.

\* \* \* \* \*